US012701777B2

(12) United States Patent
Joshi et al.

(10) Patent No.: US 12,701,777 B2
(45) Date of Patent: Aug. 4, 2026

(54) SEMICONDUCTOR DEVICE WITH SCHOTTKY CONTACT

(71) Applicant: Infineon Technologies AG, Neubiberg (DE)

(72) Inventors: Ravi Keshav Joshi, Klagenfurt am Wörthersee (AT); Fabian Rasinger, Villach (AT); Kristijan Luka Mletschnig, Klagenfurt (AT); Romain Esteve, Munich (DE); Caspar Leendertz, Munich (DE)

(73) Assignee: Infineon Technologies AG, Neubiberg (DE)

( * ) Notice: Subject to any disclaimer, the term of this patent is extended or adjusted under 35 U.S.C. 154(b) by 362 days.

(21) Appl. No.: 18/374,895

(22) Filed: Sep. 29, 2023

(65) Prior Publication Data

US 2025/0113592 A1    Apr. 3, 2025

(51) Int. Cl.
| | |
|---|---|
| *H10D 84/80* | (2025.01) |
| *H10D 8/60* | (2025.01) |
| *H10D 30/63* | (2025.01) |
| *H10D 64/27* | (2025.01) |

(52) U.S. Cl.
CPC ............. *H10D 84/811* (2025.01); *H10D 8/60* (2025.01); *H10D 30/63* (2025.01); *H10D 64/513* (2025.01)

(58) Field of Classification Search
CPC .... H10D 64/62; H10D 64/117; H10D 64/256; H10D 64/513

USPC .......................................................... 257/288
See application file for complete search history.

(56) References Cited

U.S. PATENT DOCUMENTS

| | | | |
|---|---|---|---|
| 11,322,596 B2 | 5/2022 | Konrath et al. | |
| 2018/0323273 A1* | 11/2018 | Su ........................ | H10D 62/107 |
| 2018/0358463 A1* | 12/2018 | Kobayashi ........... | H10D 30/668 |
| 2019/0172910 A1 | 6/2019 | Siemieniec et al. | |
| 2019/0341447 A1 | 11/2019 | Siemieniec et al. | |
| 2020/0083369 A1* | 3/2020 | Kobayashi ........... | H10D 64/256 |
| 2020/0219972 A1 | 7/2020 | Leendertz et al. | |
| 2021/0343835 A1 | 11/2021 | Siemieniec et al. | |

FOREIGN PATENT DOCUMENTS

DE        102021120722 A1     2/2022

* cited by examiner

*Primary Examiner* — Fazli Erdem
(74) *Attorney, Agent, or Firm* — Cooper Legal Group LLC

(57) ABSTRACT

In an embodiment, a semiconductor device is provided. The semiconductor device may include a semiconductor body including a first doped region of a first conductivity type and a second doped region of a second conductivity type. The semiconductor device may include a metal structure, in the semiconductor body, overlying the second doped region. The metal structure may include a first sidewall adjacent a first portion of the first doped region, a second sidewall adjacent a second portion of the first doped region, and a third sidewall adjacent the second doped region. The semiconductor device may include a Schottky contact including a junction of the third sidewall of the metal structure with the second doped region.

22 Claims, 18 Drawing Sheets

SEMICONDUCTOR DEVICE WITH SCHOTTKY CONTACT

TECHNICAL FIELD

The present disclosure relates to semiconductor devices.

BACKGROUND

A semiconductor device may be used in automotive electronics, industrial electronics, commercial electronics, and/or consumer electronics. A semiconductor device may comprise an electrical contact between a semiconductor and a metal that may be used to connect a component within the semiconductor device to external circuitry.

SUMMARY

This Summary is provided to introduce a selection of concepts in a simplified form that are further described below in the Detailed Description. This Summary is not intended to identify key factors or essential features of the claimed subject matter, nor is it intended to be used to limit the scope of the claimed subject matter.

In an embodiment, a semiconductor device is provided. The semiconductor device may comprise a semiconductor body comprising a first doped region of a first conductivity type and a second doped region of a second conductivity type. The semiconductor device may comprise a metal structure, in the semiconductor body, overlying the second doped region. The metal structure may comprise a first sidewall adjacent a first portion of the first doped region, a second sidewall adjacent a second portion of the first doped region, and a third sidewall adjacent the second doped region. The semiconductor device may comprise a Schottky contact comprising a junction of the third sidewall of the metal structure with the second doped region.

In an embodiment, a semiconductor device is provided. The semiconductor device may comprise a semiconductor body comprising a first doped region of a first conductivity type, a second doped region of a second conductivity type, a third doped region of the first conductivity type and a source region of the second conductivity type. The semiconductor device may comprise a first metal contact layer overlying the semiconductor body and adjacent the source region. The semiconductor device may comprise a metal structure in the semiconductor body. The metal structure may comprise a first sidewall adjacent a first portion of the first doped region and a first portion of the second doped region, a second sidewall adjacent a second portion of the first doped region and a second portion of the second doped region, a third sidewall adjacent the third doped region and/or a fourth sidewall adjacent the first metal contact layer. The semiconductor device may comprise a Schottky contact comprising a junction of the first sidewall of the metal structure with the first portion of the second doped region and/or a junction of the second sidewall of the metal structure with the second portion of the second doped region.

In an embodiment, a semiconductor device is provided. The semiconductor device may comprise a semiconductor body comprising a first doped region of a first conductivity type, a second doped region of a second conductivity type, a third doped region of the first conductivity type, and a source region of the second conductivity type. The semiconductor device may comprise a first metal contact layer overlying the semiconductor body. The first metal contact layer may be adjacent a first portion of the first doped region, a second portion of the first doped region, and a first portion of the second doped region. The semiconductor device may comprise a second metal contact layer overlying the first metal contact layer and adjacent the source region. The first portion of the second doped region may separate the first portion of the first doped region from the second portion of the first doped region. The second doped region may overlie the third doped region. The semiconductor device may comprise a Schottky contact comprising a junction of the first metal contact layer with the first portion of the second doped region.

To the accomplishment of the foregoing and related ends, the following description and annexed drawings set forth certain illustrative aspects and implementations. These are indicative of but a few of the various ways in which one or more aspects may be employed. Other aspects, advantages, and novel features of the disclosure will become apparent from the following detailed description when considered in conjunction with the annexed drawings.

DETAILED DESCRIPTION

Figure 1A:
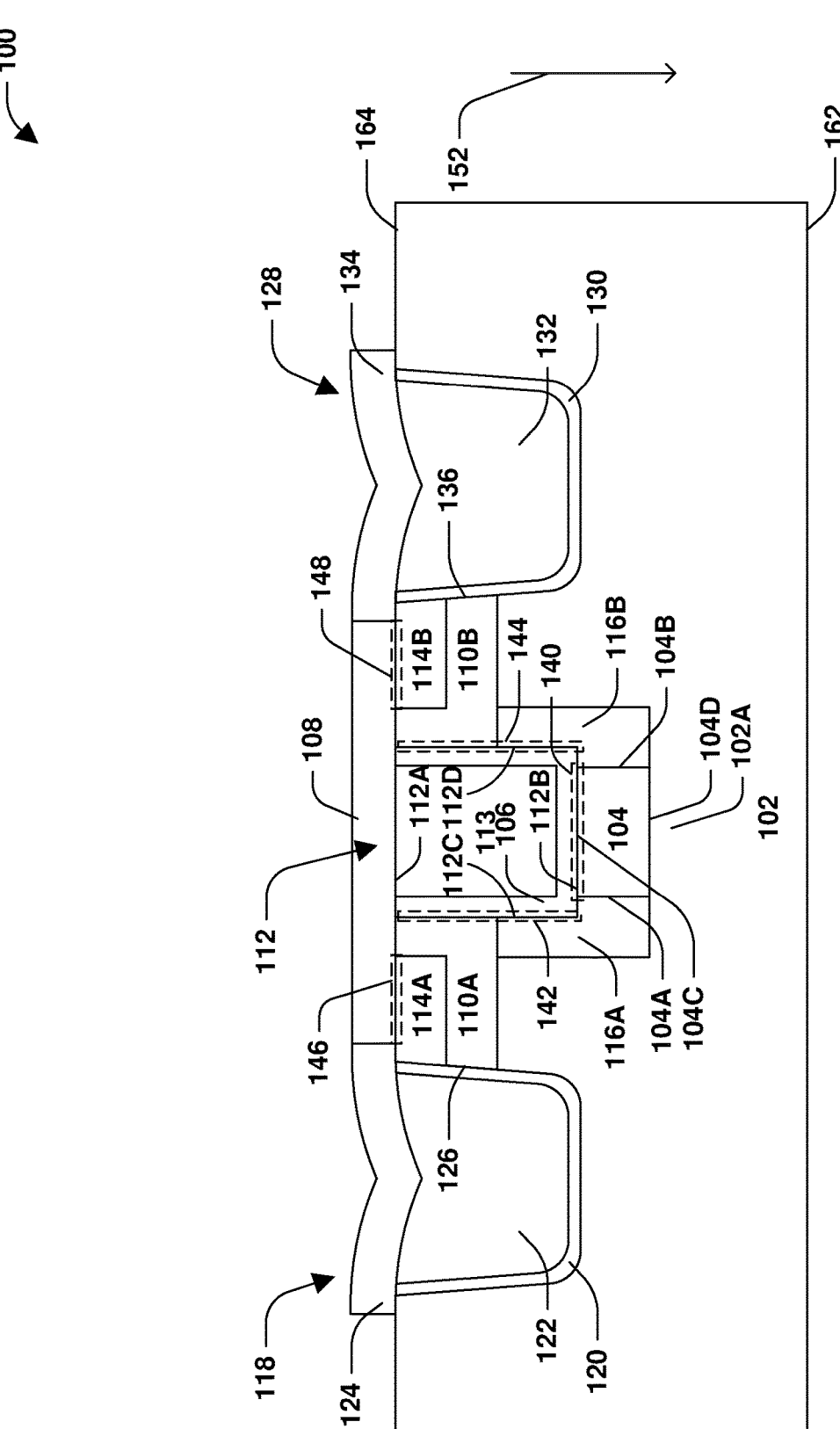
FIG. 1A illustrates a cross-sectional view of a semiconductor device according to various examples.

The claimed subject matter is now described with reference to the drawings, wherein like reference numerals are used to refer to like elements throughout. In the following description, for purposes of explanation, numerous specific details are set forth in order to provide a thorough understanding of the claimed subject matter. It may be evident, however, that the claimed subject matter may be practiced without these specific details. In other instances, well-known structures and devices are shown in block diagram form in order to facilitate describing the claimed subject matter.

It is to be understood that the following description of embodiments is not to be taken in a limiting sense. The scope of the present disclosure is not intended to be limited by the embodiments described hereinafter or by the drawings, which are taken to be illustrative only. The drawings are to be regarded as being schematic representations and elements illustrated in the drawings are not necessarily shown to scale. Rather, the various elements are represented such that their function and general purpose become apparent to a person skilled in the art.

All numerical values within the detailed description and the claims herein are modified by "about" or "approximately" the indicated value, and take into account experimental error and variations that would be expected by a person having ordinary skill in the art.

The term "over" and/or "overlying" is not to be construed as meaning only "directly over" and/or "having direct contact with". Rather, if one element is "over" and/or "overlying" another element (e.g., a region is overlying another region), a further element (e.g., a further region) may be positioned between the two elements (e.g., a further region may be positioned between a first region and a second region if the first region is "over" and/or "overlying" the second region). Further, if a first element is "over" and/or "overlying" a second element, at least some of the first element may be vertically coincident with the second element, such that a vertical line may intersect the first element and the second element.

The semiconductor substrate or body may extend along a main extension plane. The term "horizontal" as used in this specification intends to describe an orientation substantially parallel to said main extension plane. A first or main horizontal side of the semiconductor substrate or body may run substantially parallel to horizontal directions or may have surface sections that enclose an angle of at most 8° (or at most) 6° with the main extension plane. The first or main horizontal side can be for instance the surface of a wafer or a die. Sometimes, the horizontal direction is also referred to as lateral direction.

The term "vertical" as used in this specification intends to describe an orientation which is substantially arranged perpendicular to the horizontal direction, (e.g., parallel to the normal direction of the first side of the semiconductor substrate or body or parallel to the normal direction of a surface section of the first side of the semiconductor substrate or body).

In accordance with the present disclosure, a semiconductor device is provided. In some embodiments, the semiconductor device may comprise a transistor, such as a field-effect transistor (FET), a metal-oxide-semiconductor FET (MOSFET), an insulated-gate bipolar transistor (IGBT) and/or other type of transistor. In an example, the transistor is a MOSFET (e.g., a vertical MOSFET). The semiconductor device may be a high-voltage semiconductor device, e.g. configured to block voltages above 400 V or above 600 V or above 1,000 V or even above 2,000 V. The transistor (e.g., the MOSFET) may have dual functionality. In forward direction, the transistor may function as an electrical switch controlled (e.g., turned on or off) using a gate voltage (e.g., a voltage applied to a gate contact). In reverse direction, a body diode of the semiconductor may be used to conduct reverse current. The body diode may be established via a pn-junction between a p-doped region and an n-doped region. In some designs, an implant dose associated with a dopant concentration of the p-doped region may be increased to improve an ohmic contact between a metal (e.g., a metal contact layer) and the p-doped region, which may lead to one or more issues including at least one of bi-polar degradation, crystal damage, etc. In accordance with some embodiments herein, the semiconductor device may include a Schottky diode merged with the transistor. The Schottky diode may comprise a Schottky contact established from a junction between a metal and a doped region. The Schottky diode may inhibit and/or mitigate bipolar current (e.g., electron and hole current) in the semiconductor device, which may provide for reduced bi-polar degradation, reduced Qrr (reduced recovery charge), reduced reverse recovery current, reduced voltage peaks and/or improved operation of the semiconductor device.

In some embodiments of the present disclosure, the semiconductor device may comprise a metal structure (e.g., a groove) in the semiconductor body. The metal structure may be adjacent a first doped region (e.g., a shielding region and/or a body region) of a first conductivity type (e.g., p-type) and/or a Schottky region of a second conductivity type (e.g., n-type). The Schottky contact may comprise a junction between the metal structure and the Schottky region. An ohmic contact between the metal structure and the first conductivity type may comprise a junction between the metal structure and the first doped region. The metal structure may include a first sidewall (e.g., a top sidewall), a second sidewall (e.g., a bottom sidewall), a third sidewall extending (e.g., extending vertically) from the first sidewall to the second sidewall and/or a fourth sidewall extending (e.g., extending vertically) from the first sidewall to the second sidewall. In some examples, the Schottky contact and/or the ohmic contact may comprise at least some of the third sidewall and/or at least some of the fourth sidewall, which may increase a size of the Schottky contact and/or the ohmic contact as compared to implementations that do not include the metal structure, thereby providing for improved performance of the semiconductor device. In some semiconductor devices which do not have the metal structure, a size of the Schottky contact and/or the ohmic contact may be increased by increasing a horizontal extension of the Schottky contact and/or the ohmic contact (e.g., the horizontal extension may correspond to a distance by which the Schottky contact and/or the ohmic extends horizontally), thereby resulting in an enlarged pitch (e.g., horizontal distance between transistors) and/or enlarged device size. In accordance with some embodiments of the present disclosure, by including the metal structure in the semiconductor device, the size of the Schottky contact and/or the ohmic contact may be increased (vertically, for example) without increasing a pitch of the semiconductor device (and/or with a reduced pitch compared with semiconductor devices without the metal structure, for example).

In an embodiment of the presently disclosed embodiments, a semiconductor device is provided. The semiconductor device may comprise a first doped region of a first conductivity type and/or a second doped region (e.g., Schottky region) of a second conductivity type. The first doped region may comprise a shielding region and/or a body region (e.g., a channel region of the semiconductor device) overlying the shielding region. The semiconductor device may comprise a metal structure (e.g., a groove), in the semiconductor body, overlying the second doped region. The metal structure may comprise a first sidewall adjacent a first portion of the first doped region, a second sidewall adjacent a second portion of the first doped region, and/or a third sidewall adjacent the second doped region. The semiconductor device comprises a Schottky contact comprising a junction of the third sidewall of the metal structure with the second doped region.

In some examples, the semiconductor device comprises an ohmic contact comprising (i) a junction of the first sidewall of the metal structure with the first portion of the first doped region, and/or (ii) a junction of the second sidewall of the metal structure with the second portion of the first doped region.

In some examples, the semiconductor body comprises a semiconductor substrate, such as a silicon carbide (SiC) substrate. The semiconductor body may comprise one or more epitaxial layers overlying the semiconductor substrate. The one or more epitaxial layers may comprise a SiC epitaxial layer. The one or more epitaxial layers may be grown on the semiconductor substrate. Other materials and/or structures of the semiconductor body are within the scope of the present disclosure.

In some examples, the first conductivity type is p-type and/or the second conductivity type is n-type.

In some examples, a vertical position of the metal structure matches (i) a vertical position of the first portion of the first doped region (e.g., a vertical position of at least some of the metal structure matches a vertical position of at least some of the first portion of the first doped region) and/or (ii) a vertical position of a second portion of the first doped region (e.g., a vertical position of at least some of the metal structure matches a vertical position of at least some of the second portion of the first doped region).

In some examples, the semiconductor device comprises a first trench gate structure and/or a second trench gate structure. The metal structure may be between the first trench gate structure and the second trench gate structure.

In some examples, the metal structure may comprise a filling structure and/or a metal contact layer separating the filling structure from the semiconductor body. The first sidewall may comprise a first portion of the metal contact layer. The second sidewall may comprise a second portion of the metal contact layer. The third sidewall may comprise a third portion of the metal contact layer.

In an embodiment of the presently disclosed embodiments, a semiconductor device is provided. The semiconductor device may comprise a first doped region (e.g., a body region) of a first conductivity type, a second doped region (e.g., Schottky region) of a second conductivity type, a third doped region (e.g., shielding region) of the first conductivity type and/or a source region of the second conductivity type. The semiconductor device may comprise a metal structure (e.g., a groove) in the semiconductor body. The metal structure may comprise (i) a first sidewall adjacent a first portion of the first doped region and/or a first portion of the second doped region, (ii) a second sidewall adjacent a second portion of the first doped region and/or a second portion of the second doped region, (iii) a third sidewall adjacent the third doped region, and/or (iv) a fourth sidewall overlying the third sidewall. The semiconductor device may comprise a Schottky contact comprising a junction of the first sidewall of the metal structure with the first portion of the second doped region and/or a junction of the second sidewall of the metal structure with the second portion of the second doped region.

In some examples, the metal structure may comprise a filling structure and/or a first metal contact layer separating the filling structure from the semiconductor body. The first sidewall may comprise a first portion of the first metal contact layer. The second sidewall may comprise a second portion of the first metal contact layer. The third sidewall may comprise a third portion of the first metal contact layer. The fourth sidewall may comprise a fourth portion of the first metal contact layer and/or a portion of the filling structure.

In some examples, the semiconductor device may comprise a second metal contact layer overlying the semiconductor body. The second metal contact layer may be adjacent the source region. The fourth sidewall of the metal structure may be adjacent the first metal contact layer.

In some examples, the semiconductor device comprises an ohmic contact comprising (i) a junction of the first sidewall of the metal structure with the first portion of the first doped region, (ii) a junction of the second sidewall of the metal structure with the second portion of the first doped region, (iii) a junction of the second metal contact layer with a first portion of the source region, (iv) a junction of the second metal contact layer with a second portion of the source region, and/or (v) a junction of the third sidewall of the metal structure with the third doped region.

In some examples, the semiconductor body comprises a semiconductor substrate, such as a SiC substrate. The semiconductor body may comprise one or more epitaxial layers overlying the semiconductor substrate. The one or more epitaxial layers may comprise a SiC epitaxial layer. The one or more epitaxial layers may be grown on the semiconductor substrate. Other materials and/or structures of the semiconductor body are within the scope of the present disclosure.

In some examples, the first conductivity type is p-type and/or the second conductivity type is n-type.

In some examples, a vertical position of a first portion of the metal structure matches (i) a vertical position of the first portion of the first doped region (e.g., a vertical position of at least some of the first portion of the metal structure matches a vertical position of at least some of the first portion of the first doped region) and/or (ii) a vertical position of the second portion of the first doped region (e.g., a vertical position of at least some of the first portion of the metal structure matches a vertical position of at least some of the second portion of the first doped region).

In some examples, a vertical position of a second portion of the metal structure matches (i) a vertical position of the first portion of the second doped region (e.g., a vertical position of at least some of the first portion of the metal structure matches a vertical position of at least some of the first portion of the second doped region) and/or (ii) a vertical position of the second portion of the second doped region (e.g., a vertical position of at least some of the first portion of the metal structure matches a vertical position of at least some of the second portion of the second doped region).

In some examples, the semiconductor device comprises a first trench gate structure and/or a second trench gate structure. The metal structure may be between the first trench gate structure and the second trench gate structure. The semiconductor device may comprise (i) a first superjunction region, of the second conductivity type, underlying the first trench gate structure, (ii) a second superjunction region, of the first conductivity type, underlying the metal structure, and/or (iii) a third superjunction region, of the second conductivity type, underlying the second trench gate structure.

In an embodiment of the presently disclosed embodiments, a semiconductor device is provided. The semiconductor device may comprise a first doped region (e.g., a body region) of a first conductivity type, a second doped region (e.g., a Schottky region) of a second conductivity type, a third doped region (e.g., a shielding region) of the first conductivity type and/or a source region of the second conductivity type. The semiconductor device may comprise a first metal contact layer overlying the semiconductor body. The first metal contact layer may be adjacent a first portion of the first doped region, a second portion of the first doped region, and/or a first portion of the second doped region. The semiconductor device may comprise a second metal contact layer overlying the first metal contact layer. The second metal contact may be adjacent the source region. The first portion of the second doped region may separate the first portion of the first doped region from the second portion of the first doped region. The second doped region may overlie the third doped region. The semiconductor device may comprise a Schottky contact comprising a junction of the first metal contact layer with the first portion of the second doped region.

In some examples, the semiconductor device comprises an ohmic contact comprising (i) a junction of the first metal contact layer with the first portion of the first doped region, and/or (ii) a junction of the first metal contact layer with the second portion of the first doped region.

In some examples, the semiconductor body comprises a semiconductor substrate, such as a SiC substrate. The semiconductor body may comprise one or more epitaxial layers overlying the semiconductor substrate. The one or more epitaxial layers may comprise a SiC epitaxial layer. The one or more epitaxial layers may be grown on the semiconductor substrate. Other materials and/or structures of the semiconductor body are within the scope of the present disclosure.

In some examples, the first conductivity type is p-type and/or the second conductivity type is n-type.

In some examples, a vertical position of the first portion of the second doped region matches (i) a vertical position of the first portion of the first doped region (e.g., a vertical position of at least some of the first portion of the second doped region matches a vertical position of at least some of the first portion of the first doped region) and/or (ii) a vertical position of the second portion of the first doped region (e.g., a vertical position of at least some of the first portion of the second doped region matches a vertical position of at least some of the second portion of the first doped region).

In some examples, the semiconductor device comprises a first trench gate structure and/or a second trench gate structure. In some examples, a second portion of the second doped region (i) underlies the first portion of the first doped region and/or (ii) is adjacent the first trench gate structure. In some examples, a third portion of the second doped region (i) underlies the second portion of the first doped region and/or (ii) is adjacent the second trench gate structure.

An embodiment of the presently disclosed embodiments includes a method for manufacturing a semiconductor device having one or more of the components, materials, arrangements, features, characteristics and/or relationships provided herein. The method may comprise performing one or more first implantation processes to implant dopants of a first conductivity type into a semiconductor body to form a first doped region of a first conductivity type. The first doped region may comprise a shielding region and/or a body region (e.g., a channel region of the semiconductor device) overlying the shielding region. The shielding region and/or the body region may be formed concurrently (and/or in the same implantation process) or separately (and/or in different and/or separate implantation processes). The method may comprise performing a second implantation process to implant dopants of a second conductivity type into the semiconductor body to form a second doped region (e.g., Schottky region) of the second conductivity type. The method may comprise forming a first trench, and/or forming a metal structure (e.g., a groove), in the first trench, overlying the second doped region. The metal structure may comprise a first sidewall adjacent a first portion of the first doped region, a second sidewall adjacent a second portion of the first doped region, and/or a third sidewall adjacent the second doped region. The semiconductor device comprises a Schottky contact comprising a junction of the third sidewall of the metal structure with the second doped region. In some examples, the semiconductor device comprises an ohmic contact comprising (i) a junction of the first sidewall of the metal structure with the first portion of the first doped region, and/or (ii) a junction of the second sidewall of the metal structure with the second portion of the first doped region.

In some examples, the method may comprise forming a second trench and/or forming a first trench gate structure in the second trench. The method may comprise forming a third trench and/or forming a second trench gate structure in the third trench. In some examples, the first trench, the second trench and/or the third trench may have the same (and/or similar) size, shape and/or other characteristic. In some examples, the metal structure is between the first trench gate structure and the second trench gate structure.

Figure 1B:
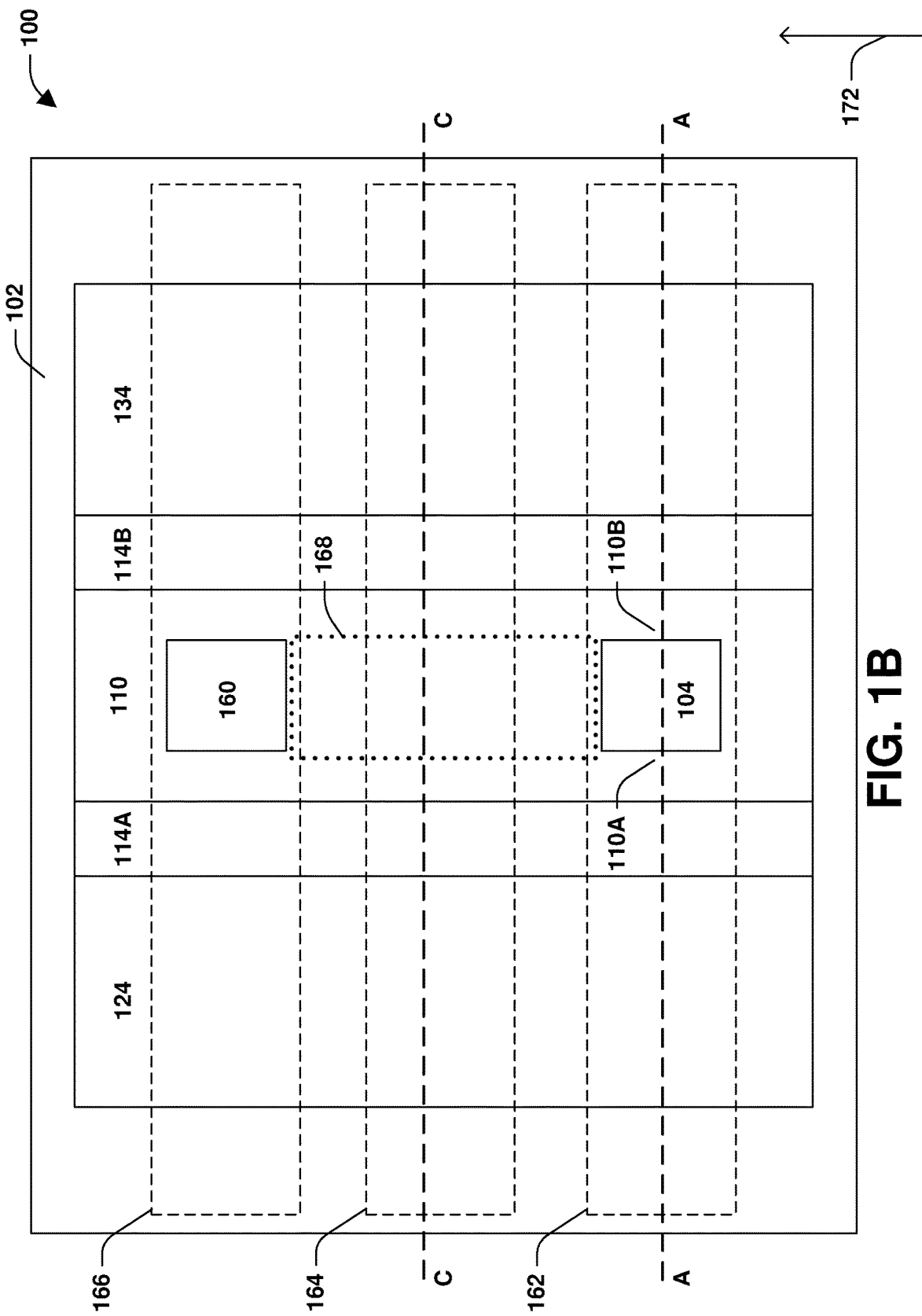
FIG. 1B illustrates a top view of a semiconductor device according to various examples.
Figure 1C:
FIG. 1C illustrates a cross-sectional view of a semiconductor device according to various examples.
Figure 1C:
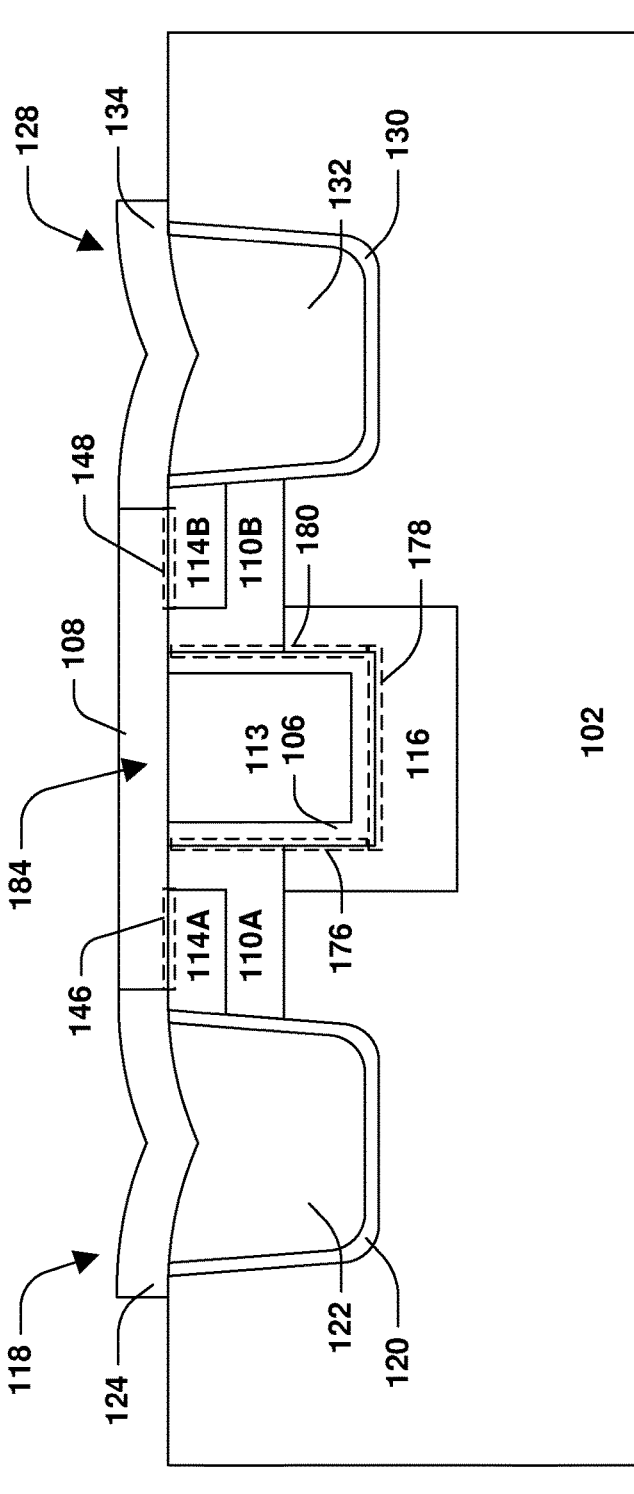

FIGS. 1A-1C illustrate aspects of a semiconductor device 100 according to various examples of the present disclosure. FIG. 1A illustrates a cross-sectional view of the semiconductor device 100 according to some embodiments. The semiconductor device 100 may comprise a semiconductor body 102, a metal structure 112 in the semiconductor body 102 a second metal contact layer 108, a first trench gate structure 118 and/or a second trench gate structure 128. In some examples, the semiconductor body 102 comprises a semiconductor substrate, such as a silicon carbide (SIC) substrate comprising SiC, a silicon substrate comprising silicon, and/or a substrate comprising other suitable substrate material. The semiconductor body 102 may comprise one or more epitaxial layers overlying the semiconductor substrate. The one or more epitaxial layers may comprise a SiC epitaxial layer. In some examples, an epitaxial layer (e.g., the SiC epitaxial layer) of the one or more epitaxial layers is grown on the semiconductor substrate. In some examples, the semiconductor device 100 comprises a buffer layer between the semiconductor substrate and the one or more epitaxial layers. In some examples, the one or more epitaxial layers comprise multiple epitaxial layers (to form a super-junction region of the semiconductor device 100, for example). In some examples, the semiconductor body 102 (e.g., the semiconductor substrate, the one or more epitaxial layers and/or the buffer layer) comprises dopants (e.g., nitrogen (N), phosphorus (P), beryllium (Be), boron (B), aluminum (Al), gallium (Ga) and/or other dopants). In an example, the semiconductor body 102 comprises n-type dopants, such as nitrogen dopants (and/or other n-type dopants).

In some examples, the semiconductor body 102 comprises (i) a first doped region of a first conductivity type, (ii) a first Schottky region 104 of a second conductivity type different than the first conductivity type, and/or (iii) a source region of the second conductivity type. In some examples, the first conductivity type is p-type and/or the second conductivity type is n-type. In some examples, the first doped region comprises (i) a body region 110 (e.g., a channel region) of the first conductivity type, and/or (ii) a shielding region 116 of the first conductivity type. In some examples, the body region 110 overlies the shielding region 116. In some examples, the body region 110 comprises a first portion 110A and a second portion 110B. In some examples, the shielding region 116 comprises (i) a first portion 116A underlying the first portion 110A of the body region 110 and/or (ii) a second portion 116B underlying the second portion 110B of the body region 110.

The body region 110 may comprise dopants of the first conductivity type (e.g., p-type), such as aluminum dopants, boron dopants, gallium dopants, beryllium dopants and/or other p-type dopants. The shielding region 116 may comprise dopants of the first conductivity type (e.g., p-type), such as aluminum dopants, boron dopants, gallium dopants, beryllium dopants and/or other p-type dopants. In some examples, a first concentration of dopants of the first conductivity type in the body region 110 (e.g., in at least a portion of the body region 110) is different than a second concentration of dopants of the first conductivity type in the shielding region 116 (e.g., in at least a portion of the shielding region 116). Embodiments are contemplated in which the first concentration of dopants is the same as the second concentration of dopants.

The first Schottky region 104 may comprise dopants of the second conductivity type (e.g., n-type), such as nitrogen dopants, phosphorus dopants and/or other n-type dopants. The source region may comprise dopants of the second conductivity type (e.g., n-type), such as nitrogen dopants, phosphorus dopants and/or other n-type dopants. In some examples, a third concentration of dopants of the second conductivity type in the first Schottky region 104 (e.g., in at least a portion of the first Schottky region 104) is different than (e.g., less than) a fourth concentration of dopants of the second conductivity type in the source region (e.g., in at least a portion of the source region). Embodiments are contemplated in which the third concentration of dopants is the same as the fourth concentration of dopants. In some examples, dopants (of the second conductivity type) in the first Schottky region 104 may comprise different dopant materials than dopants (of the second conductivity type) in the source region. Embodiments are contemplated in which dopants (of the second conductivity type) in the first Schottky region 104 comprise the same dopant material as dopants (of the second conductivity type) in the source region.

In some examples, the metal structure 112 comprises a first metal contact layer 106 and a filling structure 113. In some examples, the first metal contact layer 106 separates the filling structure 113 from the semiconductor body 102. In some examples, the first metal contact layer 106 comprises titanium, aluminum, titanium aluminide (TiAl), molybdenum nitride (MoN), and/or one or more other suitable materials. In some examples, the filling structure 113 comprises polysilicon, one or more metals (e.g., tungsten and/or other metal) and/or one or more other materials. The metal structure 112 may have a vertical position matching (i) a vertical position of a first portion of the first doped region (e.g., a vertical position of at least some of the metal structure 112 matches a vertical position of at least some of the first portion of the first doped region) and/or (ii) a vertical position of a second portion of the first doped region (e.g., a vertical position of at least some of the metal structure 112 matches a vertical position of at least some of the second portion of the first doped region). In some examples, the metal structure 112 is between the first portion of the first doped region and the second portion of the first doped region. In some examples, the first portion of the first doped region comprises (i) at least some of the first portion

110A of the body region 110 and/or (ii) at least some of the first portion 116A of the shielding region 116. In some examples, the second portion of the first doped region comprises (i) at least some of the second portion 110B of the body region 110 and/or (ii) at least some of the second portion 116B of the shielding region 116.

In some examples, the metal structure 112 comprises a first sidewall 112A (e.g., a top sidewall of the metal structure 112), a second sidewall 112B (e.g., a bottom sidewall of the metal structure 112), a third sidewall 112C (extending from the first sidewall 112A to the second sidewall 112B, for example) and/or a fourth sidewall 112D (extending from the first sidewall 112A to the second sidewall 112B, for example). In some examples, (i) the first sidewall 112A is adjacent (and/or is in contact with, is aligned with and/or adjoins) the first metal contact layer 106, (ii) the second sidewall 112B is adjacent (and/or is in contact with, is aligned with and/or adjoins) the first Schottky region 104, (iii) the third sidewall 112C is adjacent (and/or is in contact with, is aligned with and/or adjoins) the first portion of the first doped region, and/or (iv) the fourth sidewall 112D is adjacent (and/or is in contact with, is aligned with and/or adjoins) the second portion of the first doped region.

In some examples, the first sidewall 112A comprises a portion of the filling structure 113 and/or a portion of the first metal contact layer 106. In some examples (not shown), the first sidewall 112A comprises a portion, of the first metal contact layer 106, which overlies the filling structure 113. In some examples, (i) the second sidewall 112B of the metal structure 112 comprises a first portion of the first metal contact layer 106, (ii) the third sidewall 112C of the metal structure 112 comprises a second portion of the first metal contact layer 106, and/or (iii) the fourth sidewall 112D of the metal structure 112 comprises a third portion of the first metal contact layer 106. In some examples, the filling structure 113 overlies the first portion of the first metal contact layer 106.

In some examples, the filling structure 113 is between the second portion of the first metal contact layer 106 and the third portion of the first metal contact layer 106. In some examples, the filling structure 113 is adjacent (and/or is in contact with, is aligned with and/or adjoins) (i) the first portion of the first metal contact layer 106, (ii) the second portion of the first metal contact layer 106 and/or (iii) the third portion of the first metal contact layer 106.

In some examples, the semiconductor device 100 comprises a Schottky contact 140 comprising a junction of the second sidewall 112B of the metal structure 112 with the first Schottky region 104 (e.g., the Schottky contact 140 may comprise a junction of the first portion of the first metal contact layer 106 with the first Schottky region 104). In some examples, the semiconductor device 100 comprises a first ohmic contact 142 comprising a junction of the third sidewall 112C of the metal structure 112 with the first portion of the first doped region and/or a second ohmic contact 144 comprising a junction of the fourth sidewall 112D of the metal structure 112 with the second portion of the first doped region. In some examples (not shown in FIG. 1A), the second metal contact layer 108 may be chosen from a material that also creates an ohmic contact to the first portion 110A of the body region 110. In this case, the first metal layer 106 may not be present at the third sidewall 112C and/or the fourth sidewall 112D. Separately or in combination, the first metal layer 106 may be from the same material as the second metal layer 108.

In some examples, the first Schottky region 104 may have a vertical position matching a vertical position of (i) a vertical position of a third portion of the first doped region underlying the first portion of the first doped region (e.g., a vertical position of at least some of the first Schottky region 104 matches a vertical position of at least some of the third portion of the first doped region) and/or (ii) a vertical position of a fourth portion of the first doped region underlying the second portion of the first doped region (e.g., a vertical position of at least some of the first Schottky region 104 matches a vertical position of at least some of the fourth portion of the first doped region). In some examples, the third portion of the first doped region comprises at least some of the first portion 116A of the shielding region 116. In some examples, the fourth portion of the first doped region comprises at least some of the second portion 116B of the shielding region 116. In some examples, a first side 104A of the first Schottky region 104 abuts the third portion of the first doped region and/or a second side 104B abuts the fourth portion of the first doped region.

In some examples, the first Schottky region 104 has a gradient such that a concentration of dopants of the second conductivity type changes, such as increases or decreases, along a first direction 152. In an example, the first direction 152 may be a vertical direction (parallel to a vertical axis, for example). In some examples, the gradient of the first Schottky region 104 varies from a concentration of $1\times10^{20}$ centimeters$^{-3}$ (cm$^{-3}$) to a concentration of $1\times10^{16}$ cm$^{-3}$. A Schottky barrier height of the first Schottky region 104 may be a function of a concentration of dopants of the second conductivity type. In some examples, the Schottky barrier height varies from 1.0±0.5 electronvolts to 2.0±0.5 electronvolts (as a result of differences in dopant concentration across the first Schottky region 104, for example). In some examples, a fifth concentration of dopants of the second conductivity type in an upper portion of the first Schottky region 104 is greater than a sixth concentration of dopants of the second conductivity type in a lower portion of the first Schottky region 104 (e.g., the concentration of dopants of the second conductivity type in the first Schottky region 104 decreases along the first direction 152). In some examples, the fifth concentration of dopants may be in the range of at least $0.1\times10^{20}$ cm$^{-3}$ to at most $9\times10^{20}$ cm$^{-3}$, which may correspond to a Schottky barrier height of 1.0+0.5 electronvolts (e.g., the upper portion of the first Schottky region 104 may have the Schottky barrier height of 1.0±0.5 electronvolts). In some examples, the sixth concentration of dopants may be in the range of at least $0.1\times10^{16}$ cm$^{-3}$ to at most $9\times10^{16}$ cm$^{-3}$, which may correspond to a Schottky barrier height of 2.0±0.5 electronvolts (e.g., the lower portion of the first Schottky region 104 may have the Schottky barrier height of 2.0±0.5 electronvolts). The upper portion of the first Schottky region 104 overlies the lower portion of the first Schottky region 104. In some examples, the upper portion of the first Schottky region 104 may comprise a top side 104C of the first Schottky region 104 and/or the lower portion of the first Schottky region 104 may comprise a bottom side 104D of the first Schottky region 104. In some examples, the sixth concentration of dopants of the lower portion of the first Schottky region 104 is closer to a semiconductor body dopant concentration than the fifth concentration of dopants of the upper portion of the first Schottky region 104, such as that a first difference between the fifth concentration of dopants and the semiconductor body dopant concentration is greater than a second difference between the sixth concentration of dopants and the semiconductor body dopant concentration. In some examples, the second difference between the sixth concentration of dopants (of the lower portion of the first Schottky region 104) and the semiconductor body dopant concentration is smaller than a threshold difference.

In some examples, the semiconductor body dopant concentration may correspond to a concentration of dopants of the second conductivity type in a region (e.g., a doped region having the second conductivity type) of the semiconductor body 102. In some examples, the region (associated with the semiconductor body dopant concentration) may comprise at least some of a section, of the semiconductor body 102, outside of the first doped region, the first Schottky region 104 and/or the source region. In some examples, the region (associated with the semiconductor body dopant concentration) may comprise at least some of a first epitaxial layer (e.g., a SiC epitaxial layer and/or other type of epitaxial layer) of the semiconductor body 102 (e.g., the semiconductor body dopant concentration may correspond to an epitaxial dopant concentration of at least some of the first epitaxial layer). In an example, the first epitaxial layer may have the second conductivity type (and/or may comprise dopants having the second conductivity type). In some examples, the region (associated with the semiconductor body dopant concentration) may comprise a portion 102A, of the semiconductor body 102, underlying the first Schottky region 104 (e.g., the portion 102A may comprise at least some of the first epitaxial layer).

In some examples, the first Schottky region 104 having the gradient provides for an improved Schottky barrier height, an improved space charge region, improved electric field distribution and/or reduced current leakage associated with the Schottky contact 140, as compared with a device having a uniform dopant concentration across the first Schottky region 104. The improved Schottky barrier height, the improved space charge region and/or the reduced leakage current may be due, at least in part, to (i) the first difference (between the fifth concentration of dopants of the upper portion of the first Schottky region 104 and the semiconductor body dopant concentration) being greater than the second difference (between the sixth concentration of dopants of the lower portion of the first Schottky region 104 and the semiconductor body dopant concentration), (ii) the second difference being smaller than the threshold difference, and/or (iii) the fifth concentration of dopants of the upper portion of the first Schottky region 104 being greater than the sixth concentration of dopants of the lower portion of the first Schottky region 104. In some examples, the Schottky barrier height, the space charge region and/or the leakage current may be adjusted by adjusting an implant profile and/or implant species associated with an implantation process performed to form the first Schottky region 104.

In some examples, the first trench gate structure 118 comprises a first gate dielectric layer 120 and/or a first gate electrode 122, wherein the first gate dielectric layer 120 separates the first gate electrode 122 from the semiconductor body 102. In some examples, the first gate dielectric layer 120 may comprise oxide material (e.g., SiO$_2$) and/or one or more other materials. In some examples, the first gate electrode 122 may comprise one or more doped semiconductor materials, one or more metals, polysilicon and/or one or more other materials. In some examples, a first dielectric layer 124 (e.g., an interlayer dielectric) may be formed over the first gate electrode 122, wherein the first dielectric layer 124 may electrically insulate the first gate electrode 122 from one or more conductive elements of at least one of wiring, interconnection components, etc. (that are over the semiconductor body 102, for example), such as the first metal contact layer 106 and/or the second metal contact layer 108. In some examples, the second trench gate structure 128 comprises a second gate dielectric layer 130, a second gate electrode 132, and/or a second dielectric layer 134, which may have one or more of the components, materials, arrangements, features, characteristics and/or relationships provided herein with respect to the first gate dielectric layer 120, the first gate electrode 122, and/or the first dielectric layer 124, respectively.

In some examples, the metal structure 112 may have the same (and/or similar) size, shape and/or dimension (e.g., width, height, etc.) as the first gate electrode 122 and/or the second gate electrode 132. Alternatively and/or additionally, the metal structure 112 may have a different size, a different shape and/or a different dimension (e.g., width, height, etc.) compared with the first gate electrode 122 and/or the second gate electrode 132.

In some examples, the source region comprises (i) a first portion 114A between the first trench gate structure 118 and the metal structure 112 and/or (ii) a second portion 114B between the metal structure 112 and the second trench gate structure 128. In some examples, the first portion 114A of the source region (i) overlies a first part of the first portion 110A of the body region 110 and/or (ii) has a vertical position matching a vertical position of a second part of the first portion 110A of the body region 110 (e.g., the second part of the first portion 110A of the body region 110 separates the first portion 114A of the source region from the metal structure 112). The first portion 114A of the source region may be adjacent (and/or may be in contact with and/or may adjoin) the second metal contact layer 108. In some examples, the second portion 114B of the source region (i) overlies a first part of the second portion 110B of the body region 110 and/or (ii) has a vertical position matching a vertical position of a second part of the second portion 110B of the body region 110 (e.g., the second part of the second portion 110B of the body region 110 separates the second portion 114B of the source region from the metal structure 112). The second portion 114B of the source region may be adjacent (and/or may be in contact with and/or may adjoin) the second metal contact layer 108.

In some examples, the first portion 114A of the source region and/or the first portion 110A of the body region 110 may be adjacent (and/or may be in contact with and/or may adjoin) a first sidewall 126 of the first trench gate structure 118. In some examples, the first sidewall 126 of the first trench gate structure 118 corresponds to a portion of a surface of the first gate dielectric layer 120 in the first trench gate structure 118.

In some examples, the second portion 114B of the source region and/or the second portion 110B of the body region 110 may be adjacent (and/or may be in contact with and/or may adjoin) a second sidewall 136 of the second trench gate structure 128. In some examples, the second sidewall 136 of the second trench gate structure 128 corresponds to a portion of a surface of the second gate dielectric layer 130 in the second trench gate structure 128.

The metal structure 113 may be connected (e.g., electrically connected) to the first doped region (of the first conductivity type, such as p-type, for example) via the first ohmic contact 142 and/or the second ohmic contact 144.

In some examples, the second metal contact layer 108 may comprise titanium, aluminum, titanium aluminide (TiAl), molybdenum nitride (MoN), and/or one or more other suitable materials. The second metal contact layer 108 may comprise a source contact and/or may be connected (e.g., electrically connected) to the first portion 114A and/or the second portion 114B of the source region. In some examples, the second metal contact layer 108 is connected (e.g., electrically connected) to the first portion 114A and/or the second portion 114B of the source region via (i) a third ohmic contact 146 comprising a junction of the second metal contact layer 108 with the first portion 110A of the body region 110, and/or (ii) a fourth ohmic contact 148 comprising a junction of the second metal contact layer 108 with the second portion 110B of the body region 110. The semiconductor device 100 may comprise a third metal contact layer (not shown). The third metal contact layer may comprise a drain contact and/or may be connected (e.g., electrically connected) to a bottom surface 162 (e.g., a backside) of the semiconductor body 102 (that is opposite a top surface 164 of the semiconductor body 102 on which the first metal contact layer 106 and/or the second metal contact layer 108 are disposed, for example).

In some examples, the first metal contact layer 106 and the second metal contact layer 108 may comprise the same material. In some examples, the first metal contact layer 106 and the second metal contact layer 108 may (each) comprise titanium (e.g., pure titanium). Embodiments are contemplated in which the first metal contact layer 106 and the second metal contact layer 108 comprise different materials.

In some examples, a p-doped region (e.g., the first doped region, the body region 110 and/or the shielding region 116) and an n-doped region (e.g., a portion of the semiconductor body 102 that is adjacent the p-doped region) may form a pn-junction. The pn-junction may form a body diode of the semiconductor device 100. In some examples, current flows through the body diode to the third metal contact layer (e.g., the drain contact) of the semiconductor device 100. The pn-junction may correspond to a junction between a p-doped region (e.g., at least some of the first doped region) and n-doped region (e.g., at least some of the first Schottky region 104 and/or other n-doped region of the semiconductor body 102).

In some examples, the first metal contact layer 106, the second metal contact layer 108 and/or the third metal contact layer may be contacts of a transistor, such as a field-effect transistor (FET), a metal-oxide-semiconductor FET (MOSFET), an insulated-gate bipolar transistor (IGBT) and/or other type of transistor of the semiconductor device 100. In some examples, the body region 110 defines a channel of the transistor. In an example, the Schottky contact 140 corresponds to a merged pn Schottky diode (e.g., a Schottky diode merged with the pn-junction of the semiconductor device 100). In an example, the transistor is a MOSFET (e.g., a vertical MOSFET) and the channel (defined by the body region 110) is a MOSFET channel of the MOSFET. In some examples, a conductivity of the channel is controlled by a voltage applied to the first gate electrode 122 and/or the second gate electrode 132.

In some embodiments of the present disclosure, a Schottky contact (e.g., the first Schottky contact) and/or an ohmic contact may be established in a semiconductor device (e.g., the semiconductor device 100) by adjusting one or more features of the semiconductor device comprising (i) dopant material of dopants in doped regions of the semiconductor device (e.g., dopant material of dopants in the first doped region, dopant material of dopants in the first Schottky region 104, etc.), (ii) dopant concentrations of doped regions of the semiconductor device (e.g., a dopant concentration of dopants of the first conductivity type in the first doped region, a dopant concentration of dopants of the second conductivity type in the first Schottky region 104, etc.), and/or (iii) a material of a metal contact layer (e.g., material of the first metal contact layer 106, material of the second metal contact layer 108, etc.).

In an example, the source region (e.g., the first portion 114A and/or the second portion 114B of the source region) may comprise phosphorus dopants, and/or the second metal contact layer 108 may comprise titanium (e.g., pure titanium). When the source region comprises phosphorus dopants and the second metal contact layer 108 comprises titanium, an ohmic contact (e.g., the third ohmic contact 146 and/or the fourth ohmic contact 148) may be established between the source region and the second metal contact layer 108.

In an example, the first doped region (e.g., the body region 110 and/or the shielding region 116) may comprise aluminum dopants, and/or the first metal contact layer 106 may comprise titanium (e.g., pure titanium). When the first doped region comprises aluminum dopants and the first metal contact layer 106 comprises titanium, an ohmic contact (e.g., the first ohmic contact 142 and/or the second ohmic contact 144) may be established between the first doped region and the first metal contact layer 106.

In an example, the first doped region (e.g., the body region 110 and/or the shielding region 116) may comprise aluminum dopants, and/or the first metal contact layer 106 may comprise titanium aluminide. When the first doped region comprises aluminum dopants and the first metal contact layer 106 comprises titanium aluminide, an ohmic contact (e.g., the first ohmic contact 142 and/or the second ohmic contact 144) may be established between the first doped region and the first metal contact layer 106.

In an example, the first Schottky region 104 may comprise nitrogen dopants, and/or the first metal contact layer 106 may comprise titanium (e.g., pure titanium). When the first Schottky region 104 comprises nitrogen dopants and the first metal contact layer 106 112 comprises titanium, a Schottky contact (e.g., the Schottky contact 140) may be established between the first Schottky region 104 and the first metal contact layer 106.

In an example, the first Schottky region 104 may comprise nitrogen dopants, and/or the first metal contact layer 106 may comprise titanium aluminide. When the first Schottky region 104 comprises nitrogen dopants and the first metal contact layer 106 comprises titanium aluminide, a Schottky contact (e.g., the Schottky contact 140) may be established between the first Schottky region 104 and the first metal contact layer 106.

In an example, the first Schottky region 104 may comprise phosphorus dopants, and/or the first metal contact layer 106 may comprise titanium aluminide. When the first Schottky region 104 comprises phosphorus dopants and the first metal contact layer 106 comprises titanium aluminide, a Schottky contact (e.g., the Schottky contact 140) may be established between the first Schottky region 104 and the first metal contact layer 106. In some examples, the Schottky contact may be established when an aluminum content of the first metal contact layer 106 is greater than a threshold aluminum content.

Embodiments are contemplated in which the first metal contact layer 106 and the metal structure 112 comprise different materials, such as where the first metal contact layer 106 comprises titanium aluminide and the metal structure 112 comprises titanium (e.g., pure titanium), or vice versa.

Other materials of features other than those explicitly provided herein are within the scope of the present disclosure.

In an example, the first metal contact layer 106 and the second metal contact layer 108 may (each) comprise titanium (e.g., pure titanium). It may be appreciated that the first metal contact layer 106 and the second metal contact layer 108 comprising the same material (e.g., titanium) may provide for reduced processing complexity to form the semiconductor device 100 (as a result of requiring a reduced number of different materials to form the semiconductor device 100, for example). In the example, the source region may comprise phosphorus dopants, the first doped region (e.g., the body region 110 and/or the shielding region 116) may comprise aluminum dopants, and/or the first Schottky region 104 may comprise nitrogen dopants.

In an example, a single contact structure, such as a single contact layer, comprises the first metal contact layer 106 and the second metal contact layer 108 (e.g., the first metal contact layer 106 and the second metal contact layer 108 are each part of the single contact structure). In some examples, when the first metal contact layer 106 and the second metal contact layer 108 are part of the single contact structure, an ohmic contact (not shown) is established between the single contact structure (e.g., the second metal contact layer 108) and a top surface of the first portion 110A of the body region 110 and/or an ohmic contact (not shown) is established between the single contact structure (e.g., the second metal contact layer 108) and a top surface of the second portion 110B of the body region 110.

FIG. 1B illustrates a top view of the semiconductor device 100 according to some embodiments. In some examples, the view depicted in FIG. 1A is a cross sectional view taken along line A-A of FIG. 1B. For ease of illustration, the first metal contact layer 106, the second metal contact layer 108 and/or the filling structure 113 are removed in FIG. 1B to show a top view of doped regions (e.g., the source region, the first Schottky region 104, etc.) in the semiconductor body 102. In some examples, one or more components of the semiconductor device 100, such as the first dielectric layer 124, the second dielectric layer 134, the source region and/or the first doped region (e.g., the body region 110 and/or the shielding region 116), are arranged in a striped manner.

In some examples, the semiconductor device 100 comprises a first portion 162 (e.g., a first transistor cell) comprising a first transistor (e.g., a first MOSFET), a second portion 164 comprising a second transistor (e.g., a second MOSFET) and/or a third portion 166 comprising a third transistor (e.g., a third MOSFET). In some examples, the first Schottky region 104 is in an active area of the first transistor. In some examples, along a second direction 172 (e.g., a horizontal direction), transistors may alternate between having a Schottky region (e.g., a transistor, such as the first transistor, with an integrated Schottky diode) and not having a Schottky region (e.g., a transistor, such as the second transistor, without an integrated Schottky diode). For example, the first transistor may comprise the first Schottky region 104, the second transistor may not comprise a Schottky region (e.g., the second portion 164 does not comprise a doped region of the second conductivity type that forms a Schottky contact with a metal structure), the third transistor may comprise a second Schottky region 160 (e.g., the third transistor may comprise an integrated Schottky diode), etc.

In some examples, the second Schottky region 160 (e.g., a doped region of the second conductivity type) in the third portion 166 may have one or more of the components, materials, arrangements, features, characteristics and/or relationships provided herein with respect to the first Schottky region 104. In some examples, the second Schottky region 160 may have a vertical position matching a vertical position of the first Schottky region 104 (e.g., a vertical position of at least some of the second Schottky region 160 matches a vertical position of at least some of the first Schottky region 104). In an example, the third portion 166 of the semiconductor device 100 may comprise a second metal structure (not shown). The second metal structure may be the same as (e.g., may be a continuation of) the metal structure 112 (shown in FIG. 1A). For example, the metal structure 112 may extend (with a stripe-like manner, for example) through the first portion 162, the second portion 164 and/or the third portion 166 of the semiconductor device 100. Alternatively and/or additionally, the second metal structure may be separate and/or isolated from the metal structure 112. In some examples, the second metal structure in the third portion 166 may have one or more of the components, materials, arrangements, features, characteristics and/or relationships provided herein with respect to the metal structure 112. The third portion 166 may comprise a second Schottky contact comprising a junction of the second metal structure with the second Schottky region 160.

In some examples, the first doped region may extend (with a stripe-like manner, for example) through the first portion 162, the second portion 164 and/or the third portion 166 of the semiconductor device 100. A fifth portion 168 of the first doped region (e.g., the body region 110 and/or the shielding region 116 underlying the body region 110) may separate the first Schottky region 104 from the second Schottky region 160 in the third portion 166. In some examples, the fifth portion 168 of the first doped region may comprise a portion of the body region 110 and/or a portion of the shielding region 116. In some examples, the fifth portion 168 of the first doped region provides shielding between adjacent Schottky regions, such as the first Schottky region 104 and the second Schottky region 160, which may provide for improved performance of the semiconductor device 100. Embodiments are contemplated in which the second transistor may (also) comprise a Schottky region, and/or where each transistor of a set of transistors of the semiconductor device 100 (e.g., some and/or all transistors of the semiconductor device 100) comprises an integrated Schottky diode. Embodiments are contemplated in which the first Schottky region 104 extends (continuously, for example) through two or more adjacent portions of the semiconductor device 100 (e.g., the first portion 162, the second portion 164 and/or the third portion 166), wherein in each portion of the two or more adjacent portions, a Schottky contact is established between the first Schottky region 104 and a metal in the portion.

FIG. 1C illustrates a cross sectional view of the second portion 164 of the semiconductor device 100 taken along line C-C of FIG. 1B, according to some embodiments. In some examples, the second portion 164 of the semiconductor device 100 may not comprise a Schottky region, and thus a Schottky contact is not integrated in the second transistor in the second portion 164 of the semiconductor device 100 (e.g., a Schottky contact is not established between a metal structure and a Schottky region in the second portion 164).

In some examples, the second portion 164 of the semiconductor device 100 may comprise a third metal structure 184. The third metal structure 184 may be the same as (e.g., may be a continuation of) the metal structure 112 (shown in FIG. 1A). Alternatively and/or additionally, the third metal structure 184 may be separate and/or isolated from the metal structure 112. In some examples, the third metal structure 184 in the second portion 164 may have one or more of the components, materials, arrangements, features, characteristics and/or relationships provided herein with respect to the metal structure 112. In some examples, in the second portion 164 of the semiconductor device 100, the third metal structure 184 may be connected (e.g., electrically connected) to the first doped region (e.g., the body region 110 and/or the shielding region 116) via ohmic contacts 176, 178 and/or 180.

Figure 2A:
FIG. 2A illustrates a cross-sectional view of a semiconductor device according to various examples.
Figure 2A:
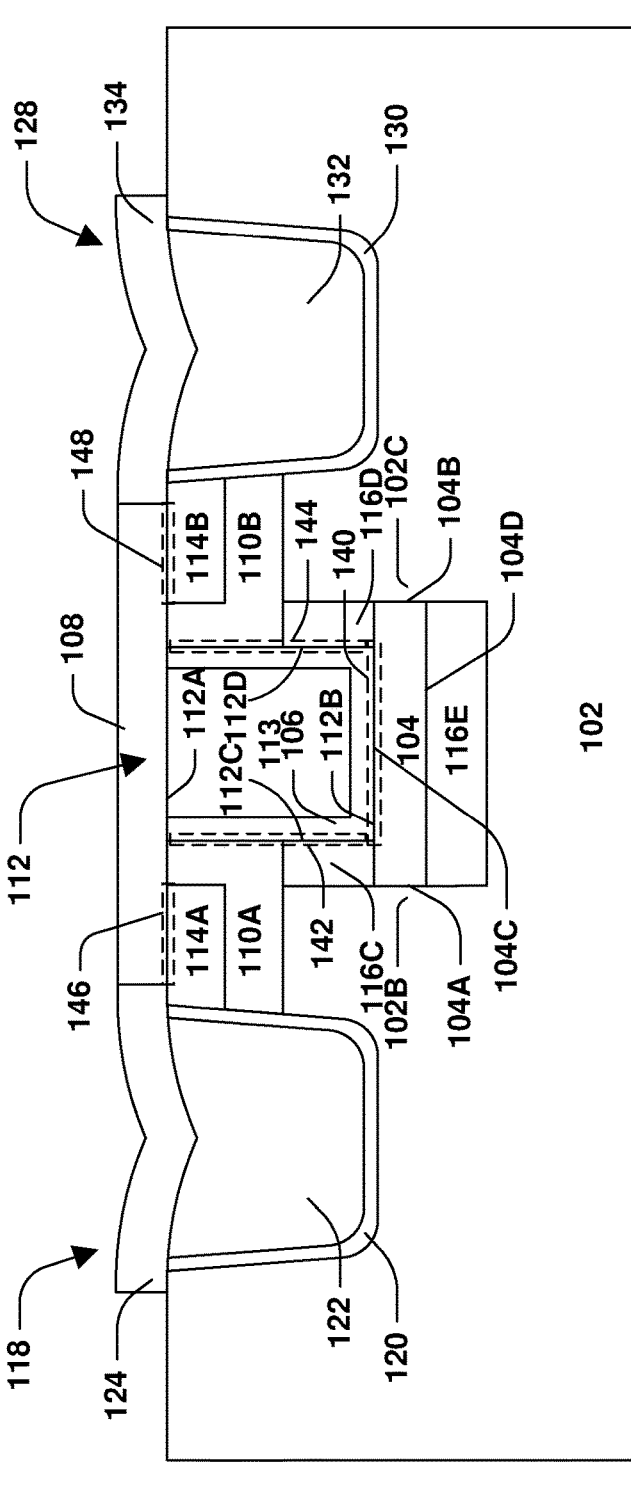
Figure 2B:
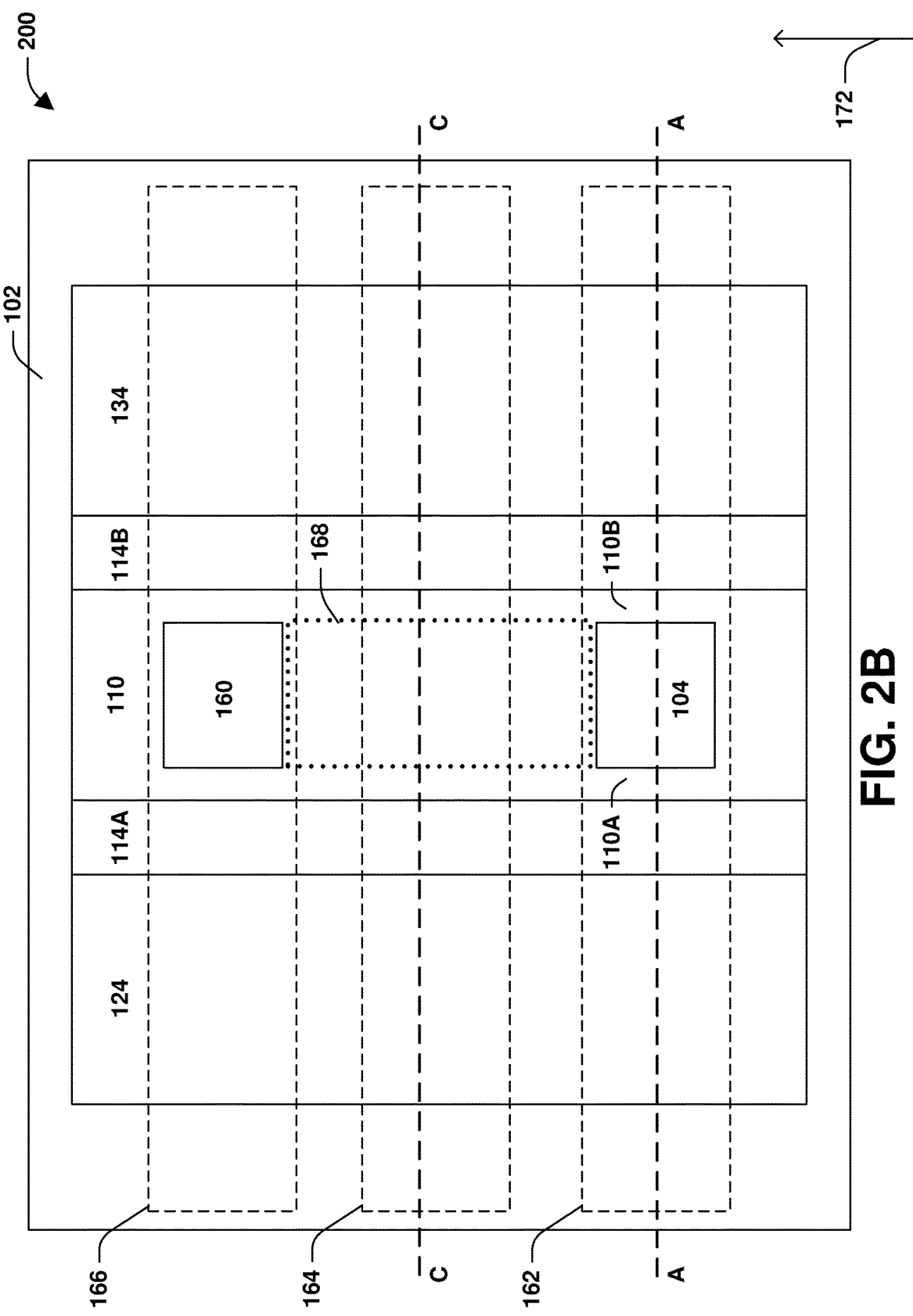
FIG. 2B illustrates a top view of a semiconductor device according to various examples.
Figure 2C:
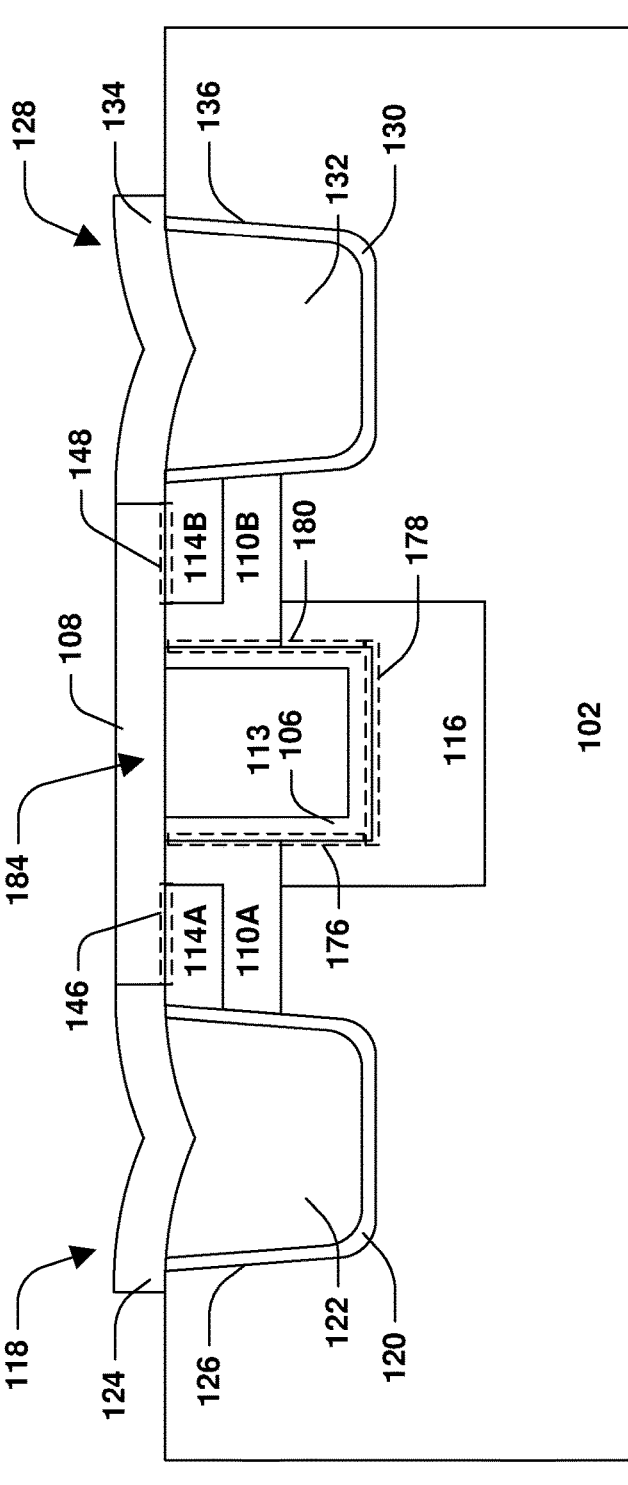
FIG. 2C illustrates a cross-sectional view of a semiconductor device according to various examples.

FIGS. 2A-2C illustrate aspects of a semiconductor device 200 according to various examples of the present disclosure. FIG. 2A illustrates a cross-sectional view of the semiconductor device 200 according to some embodiments. The semiconductor device 200 may comprise the semiconductor body 102, the metal structure 112 in the semiconductor body 102, the second metal contact layer 108, the first trench gate structure 118 and/or the second trench gate structure 128. In some examples, the semiconductor device 200 (and/or one or more components of the semiconductor device 200) may have one, some and/or all of the components, materials, arrangements, features, characteristics and/or relationships provided herein with respect to the semiconductor device 100 and/or shown in and/or described with respect to FIGS. 1A-1C and/or other parts of the present disclosure. In some examples, the semiconductor body 102 comprises (i) the first doped region of the first conductivity type, (ii) the first Schottky region 104 of the second conductivity type different than the first conductivity type, and/or (iii) the source region (comprising the first portion 114A and the second portion 114B of the second conductivity type. In some examples, the first conductivity type is p-type and/or the second conductivity type is n-type. In some examples, the first doped region comprises (i) the body region 110 having the first conductivity type and/or (ii) the shielding region 116 having the first conductivity type. In some examples, the body region 110 overlies the shielding region 116.

In some examples, the shielding region 116 and/or the first Schottky region 104 may be arranged differently in the semiconductor device 200 as compared with the semiconductor device 100 of FIGS. 1A-1C. In some examples, the first Schottky region 104 of the semiconductor device 200 is arranged such that (i) the first side 104A of the first Schottky region 104 abuts a portion 102B, of the semiconductor body 102, laterally offset from the first Schottky region 104 and/or the shielding region 116, and/or (ii) the second side 104B of the first Schottky region 104 abuts a portion 102C, of the semiconductor body 102, laterally offset from the first Schottky region 104 and/or the shielding region 116. The shielding region 116 may comprise a first portion 116C overlying the first Schottky region 104, a second portion 116D overlying the first Schottky region 104, and/or a third portion 116E underlying the first Schottky region 104.

In some examples, the semiconductor device 200 comprises a Schottky contact 140 comprising a junction of the second sidewall 112B of the metal structure 112 with the first Schottky region 104. In some examples, the semiconductor device 200 comprises a first ohmic contact 142 comprising a junction of the third sidewall 112C of the metal structure 112 with the first portion 110A of the body region 110 and/or the first portion 116C of the shielding region 116, a second ohmic contact 144 comprising a junction of the fourth sidewall 112D of the metal structure 112 with the second portion 110B of the body region 110 and/or the second portion 116D of the shielding region 116, a third ohmic contact 146 comprising a junction of the second metal contact layer 108 with the first portion 110A of the body region 110, and/or a fourth ohmic contact 148 comprising a junction of the second metal contact layer 108 with the second portion 110B of the body region 110.

FIG. 2B illustrates a top view of the semiconductor device 200 according to some embodiments. In some examples, the view depicted in FIG. 2A is a cross sectional view taken along line A-A of FIG. 2B. For ease of illustration, the first metal contact layer 106, the second metal contact layer 108 and/or the filling structure 113 are removed in FIG. 2B to show a top view of doped regions (e.g., the source region, the first Schottky region 104, etc.) in the semiconductor body 102 of the semiconductor device 200. In some examples, the first Schottky region 104 is in an active area of a first transistor in a first portion 162 of the semiconductor device 200. In some examples, along the second direction 172, transistors may alternate between having a Schottky region and not having a Schottky region. For example, the first transistor may comprise the first Schottky region 104, a second transistor in a second portion 164 of the semiconductor device 200 may not comprise a Schottky region, a third transistor in a third portion 166 of the semiconductor device 200 may comprise a second Schottky region 160, etc. In some examples, the second Schottky region 160 may have one or more of the components, materials, arrangements, features, characteristics and/or relationships provided herein with respect to the first Schottky region 104. Embodiments are contemplated in which the second transistor may (also) comprise a Schottky region, and/or where each transistor of a set of transistors of the semiconductor device 200 (e.g., some and/or all transistors of the semiconductor device 200) comprises an integrated Schottky diode. Embodiments are contemplated in which the first Schottky region 104 extends (continuously, for example) through two or more adjacent portions of the semiconductor device 200 (e.g., the first portion 162, the second portion 164 and/or the third portion 166), wherein in each portion of the two or more adjacent portions, a Schottky contact is established between the first Schottky region 104 and a metal in the portion.

A fifth portion 168 of the first doped region (e.g., the body region 110 and/or the shielding region 116 underlying the body region 110) may separate the first Schottky region 104 from the second Schottky region 160 in the third portion 166. In some examples, the fifth portion 168 of the first doped region may comprise a portion of the body region 110 and/or a portion of the shielding region 116. In some examples, the fifth portion 168 of the first doped region provides shielding between adjacent Schottky regions, such as the first Schottky region 104 and the second Schottky region 160, which may provide for improved performance of the semiconductor device 200.

FIG. 2C illustrates a cross sectional view of the second portion 164 of the semiconductor device 200 taken along line C-C of FIG. 2B, according to some embodiments. In some examples, the second portion 164 of the semiconductor device 200 may not comprise a Schottky region. In some examples, in the second portion 164 of the semiconductor device 200, the third metal structure 184 may be connected (e.g., electrically connected) to the first doped region (e.g., the body region 110 and/or the shielding region 116) via ohmic contacts 176, 178 and/or 180.

Figure 3A:
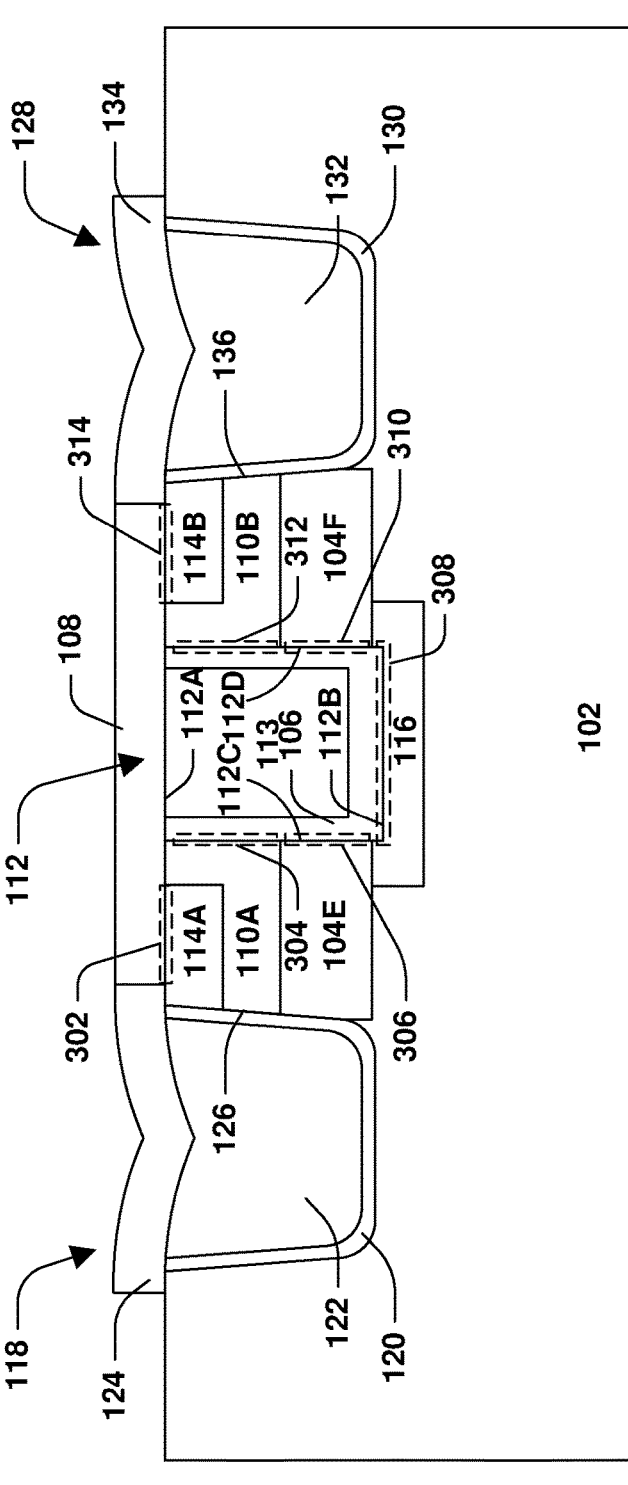
FIG. 3A illustrates a cross-sectional view of a semiconductor device according to various examples.
Figure 3B:
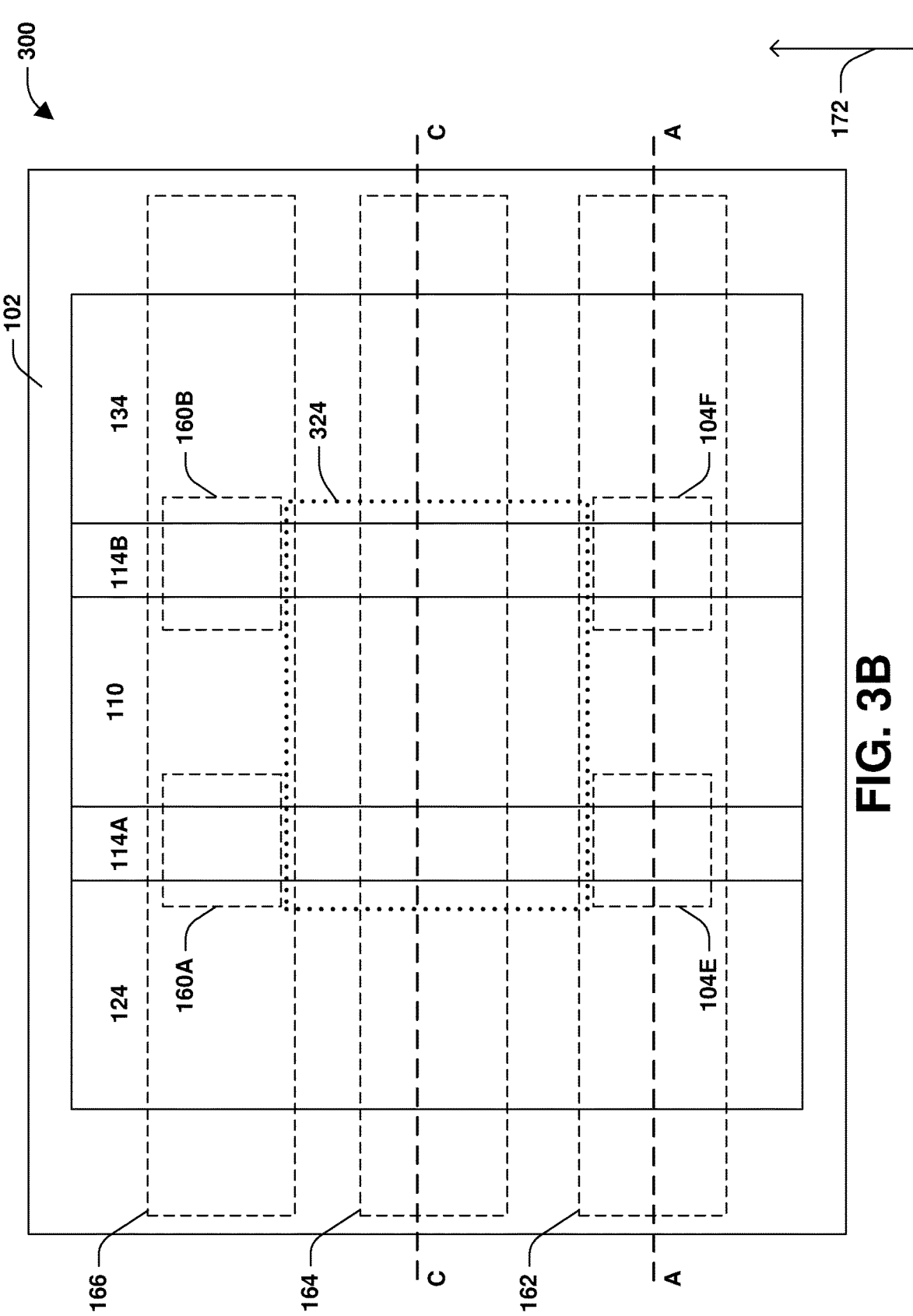
FIG. 3B illustrates a top view of a semiconductor device according to various examples.
Figure 3C:
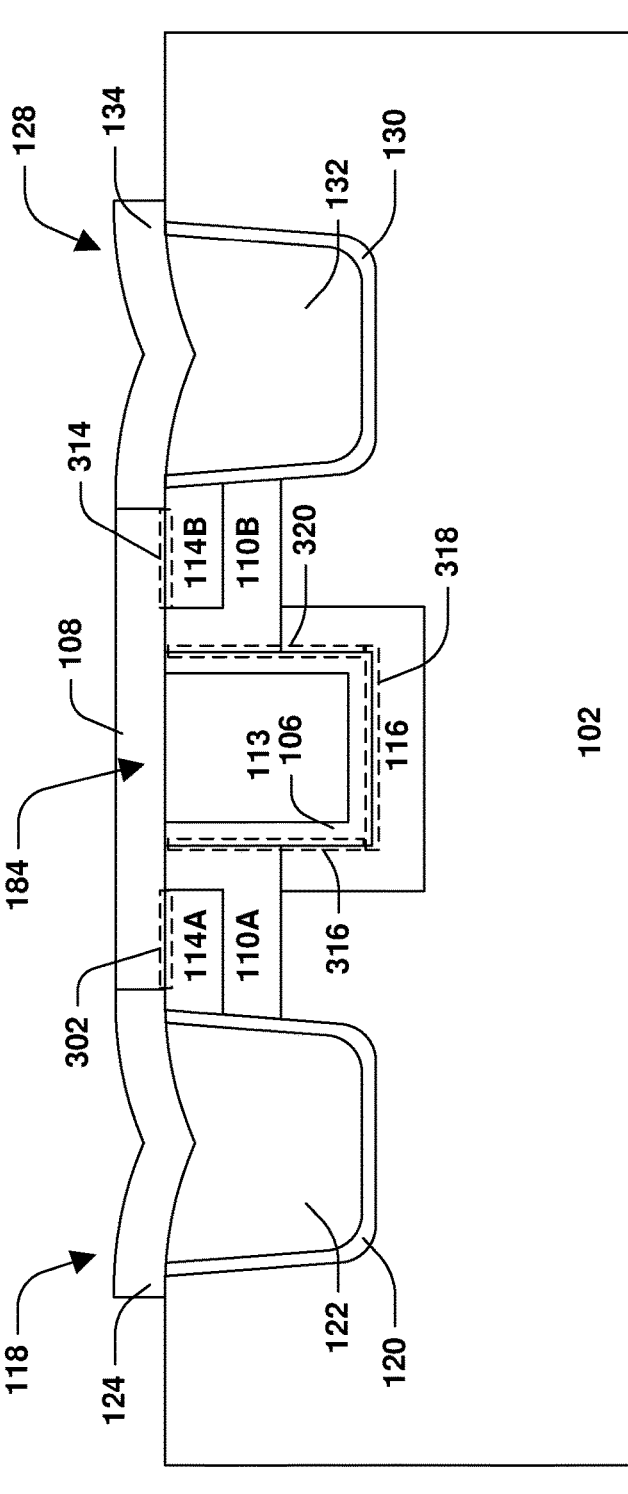
FIG. 3C illustrates a cross-sectional view of a semiconductor device according to various examples.

FIGS. 3A-3C illustrate aspects of a semiconductor device 300 according to various examples of the present disclosure. FIG. 3A illustrates a cross-sectional view of the semiconductor device 300 according to some embodiments. The semiconductor device 300 may comprise the semiconductor body 102, the metal structure 112 in the semiconductor body 102, the second metal contact layer 108, the first trench gate structure 118 and/or the second trench gate structure 128. In some examples, the semiconductor device 300 (and/or one or more components of the semiconductor device 300) may have one, some and/or all of the components, materials, arrangements, features, characteristics and/or relationships provided herein with respect to the semiconductor device 100 and/or shown in and/or described with respect to FIGS. 1A-1C and/or other parts of the present disclosure. In some examples, the semiconductor body 102 comprises (i) the first doped region of the first conductivity type, (ii) the first Schottky region 104 of the second conductivity type different than the first conductivity type, and/or (iii) the source region (comprising the first portion 114A and the second portion 114B) of the second conductivity type. In some examples, the first conductivity type is p-type and/or the second conductivity type is n-type. In some examples, the first doped region comprises (i) the body region 110 having the first conductivity type and/or (ii) the shielding region 116 having the first conductivity type. In some examples, the body region 110 overlies the shielding region 116.

In some examples, the shielding region 116 and/or the first Schottky region 104 may be arranged differently in the semiconductor device 300 as compared with the semiconductor device 100 of FIGS. 1A-1C and/or the semiconductor device 200 of FIGS. 2A-2C. In some examples, the first Schottky region 104 of the semiconductor device 300 comprises a first portion 104E underlying (and/or in contact with and/or adjoining) the first portion 110A of the body region 110 and/or a second portion 104F underlying (and/or in contact with and/or adjoining) the second portion 110B of the body region 110. In some examples, the metal structure 112 is between the first portion 104E and the second portion 104F of the first Schottky region 104. In some examples, the first portion 104E of the first Schottky region 104 may be adjacent (and/or may be in contact with and/or may adjoin) the first sidewall 126 of the first trench gate structure 118. In some examples, the second portion 104F of the first Schottky region 104 may be adjacent (and/or may be in contact with and/or may adjoin) the second sidewall 136 of the second trench gate structure 128.

In some examples, the semiconductor device 300 comprises a first Schottky contact 306 comprising a junction of the third sidewall 112C of the metal structure 112 with the first portion 104E of the first Schottky region 104 and/or a second Schottky contact 310 comprising a junction of the fourth sidewall 112D of the metal structure 112 with the second portion 104F of the first Schottky region 104. In some examples, the semiconductor device 300 comprises a first ohmic contact 304 comprising a junction of the third sidewall 112C of the metal structure 112 with the first portion 110A of the body region 110, a second ohmic contact 312 comprising a junction of the fourth sidewall 112D of the metal structure 112 with the second portion 110B of the body region 110, a third ohmic contact 302 comprising a junction of the second metal contact layer 108 with the first portion 114A of the source region, a fourth ohmic contact 314 comprising a junction of the second metal contact layer 108 with the second portion 114B of the source region, and/or a fifth ohmic contact 308 comprising a junction of the second sidewall 112B of the metal structure 112 with the shielding region 116.

A depth of the second sidewall 112B (e.g., bottom side-wall) of the metal structure 112 may be tuned (by adjusting a depth of a trench formed to form the metal structure 112, for example) to adjoin a portion of the shielding region 116 (such as shown in FIG. 3A) or to adjoin a portion of the first Schottky region 104 (and/or other region of the semiconductor body 102). In an embodiment in which the second sidewall 112B of the metal structure 112 adjoins a portion of the first Schottky region 104, a Schottky contact may be established comprising a junction of the second sidewall 112B of the metal structure 112 with the portion of the first Schottky region 104. In some examples, the semiconductor device 300 may have improved dynamic switching performance when the second sidewall 112B adjoins a portion of the shielding region 116 (such as shown in FIG. 3A) as compared to an embodiment in which the second sidewall 112B adjoins a portion of the first Schottky region 104.

FIG. 3B illustrates a top view of the semiconductor device 300 according to some embodiments. In some examples, the view depicted in FIG. 3A is a cross sectional view taken along line A-A of FIG. 3B. For ease of illustration, the first metal contact layer 106, the second metal contact layer 108 and/or the filling structure 113 are removed in FIG. 3B to show a top view of doped regions (e.g., the source region, the first Schottky region 104, etc.) in the semiconductor body 102 of the semiconductor device 300. In some examples, the first Schottky region 104 is in an active area of a first transistor in a first portion 162 of the semiconductor device 300. In some examples, along the second direction 172, transistors may alternate between having a Schottky region and not having a Schottky region. For example, the first transistor may comprise the first Schottky region 104, a second transistor in a second portion 164 of the semiconductor device 300 may not comprise a Schottky region, a third transistor in a third portion 166 of the semiconductor device 300 may comprise a second Schottky region 160 (e.g., the second Schottky region 160 may comprise a first portion 160A and a second portion 160B), etc. In some examples, the second Schottky region 160 may have one or more of the components, materials, arrangements, features, characteristics and/or relationships provided herein with respect to the first Schottky region 104. Embodiments are contemplated in which the second transistor may (also) comprise a Schottky region, and/or where each transistor of a set of transistors of the semiconductor device 300 (e.g., some and/or all transistors of the semiconductor device 300) comprises an integrated Schottky diode. Embodiments are contemplated in which the first Schottky region 104 extends (continuously, for example) through two or more adjacent portions of the semiconductor device 300 (e.g., the first portion 162, the second portion 164 and/or the third portion 166), wherein in each portion of the two or more adjacent portions, a Schottky contact is established between the first Schottky region 104 and a metal in the portion. Although the first Schottky region 104 and/or the second Schottky region 160 may underlie the source region, the first dielectric layer 124, the second dielectric layer 134 and/or the body region 110 (and thus the first Schottky region 104 and/or the second Schottky region 160 may not actually be visible from a top view), FIG. 3B illustrates dashed-line outlines of positions of the first portion 104E of the first Schottky region 104, the second portion 104F of the first Schottky region 104, the first portion 160A of the second Schottky region 160, and/or the second portion 160B of the second Schottky region 160.

In some examples, a portion 324 of the semiconductor device 300 may separate the first Schottky region 104 from the second Schottky region 160 in the third portion 166 (e.g., the portion 324 may (i) separate the first portion 104E of the first Schottky region 104 from the first portion 160A of the second Schottky region 160, and/or (ii) separate the second portion 104F of the first Schottky region 104 from the second portion 160B of the second Schottky region 160). The portion 324 of the semiconductor device 300 may comprise a portion of the first doped region (which may comprise a portion of the body region 110 and/or a portion of the shielding region 116). In some examples, the portion 324 of the semiconductor device 300 (e.g., the portion of the first doped region) provides shielding between adjacent Schottky regions, such as the first Schottky region 104 and the second Schottky region 160, which may provide for improved performance of the semiconductor device 300.

FIG. 3C illustrates a cross sectional view of the second portion 164 of the semiconductor device 300 taken along line C-C of FIG. 3B, according to some embodiments. In some examples, the second portion 164 of the semiconductor device 300 may not comprise a Schottky region. In some examples, in the second portion 164 of the semiconductor device 300, the third metal structure 184 may be connected (e.g., electrically connected) to the first doped region (e.g., the body region 110 and/or the shielding region 116) via ohmic contacts 316, 318 and/or 320.

Figure 4A:
FIG. 4A illustrates a cross-sectional view of a semiconductor device according to various examples.
Figure 4A:
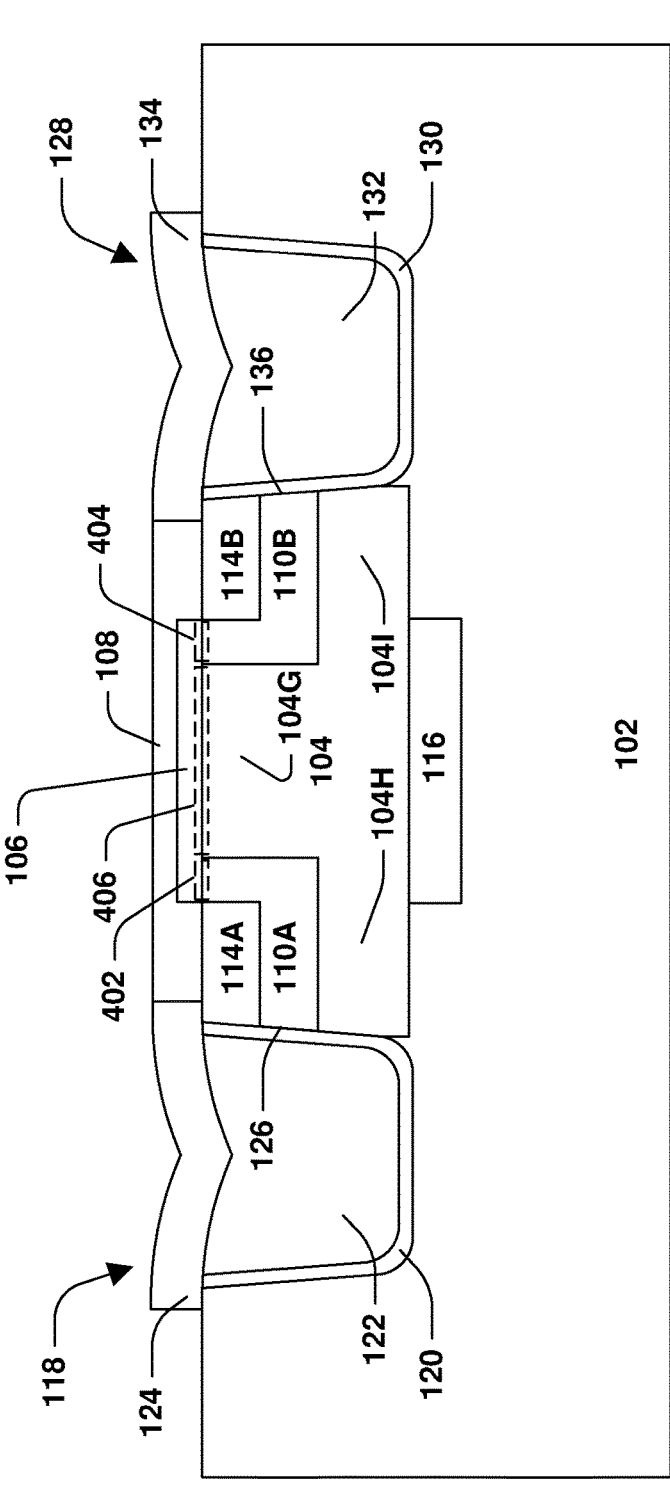
Figure 4B:
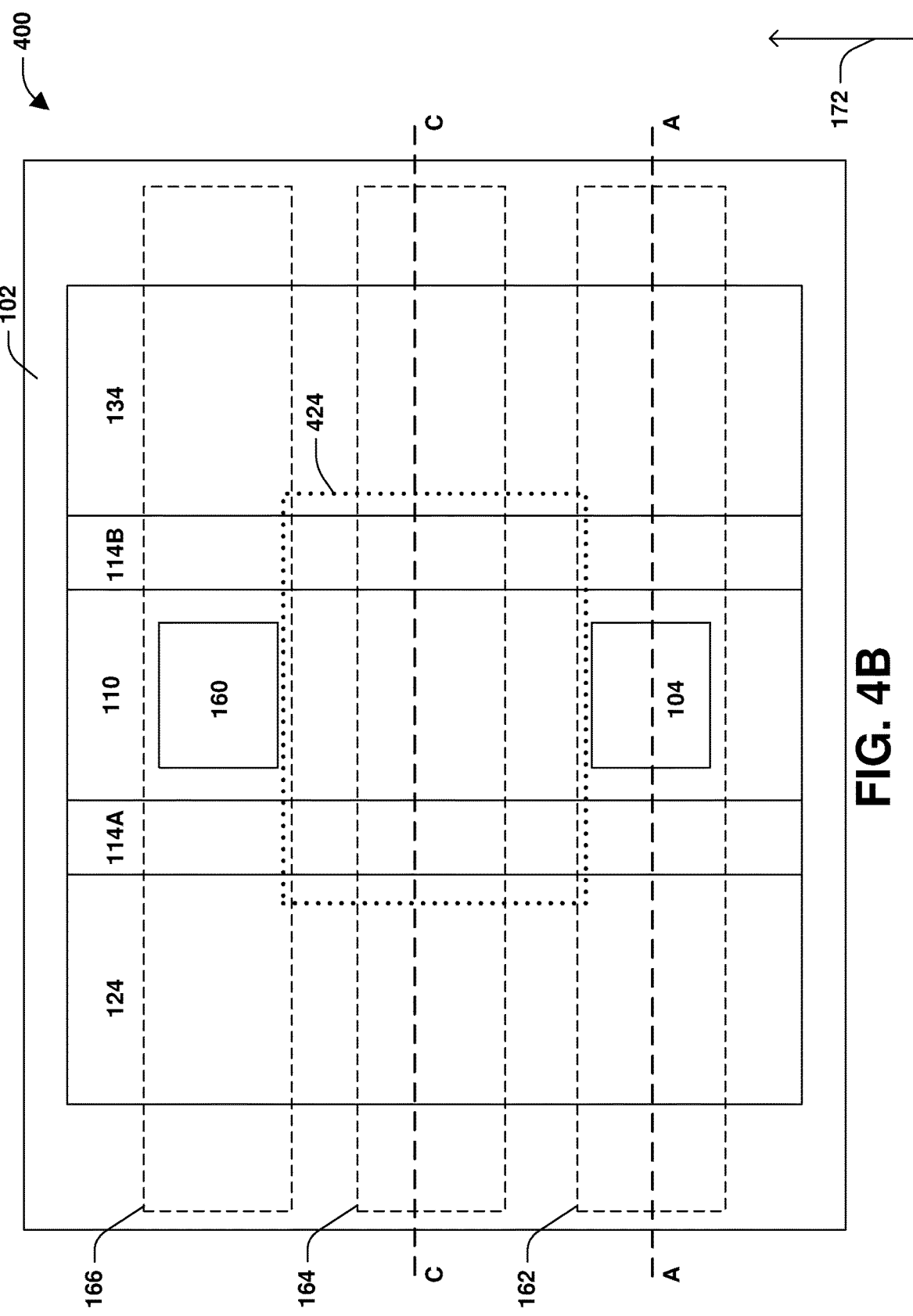
FIG. 4B illustrates a top view of a semiconductor device according to various examples.
Figure 4C:
FIG. 4C illustrates a cross-sectional view of a semiconductor device according to various examples.
Figure 4C:
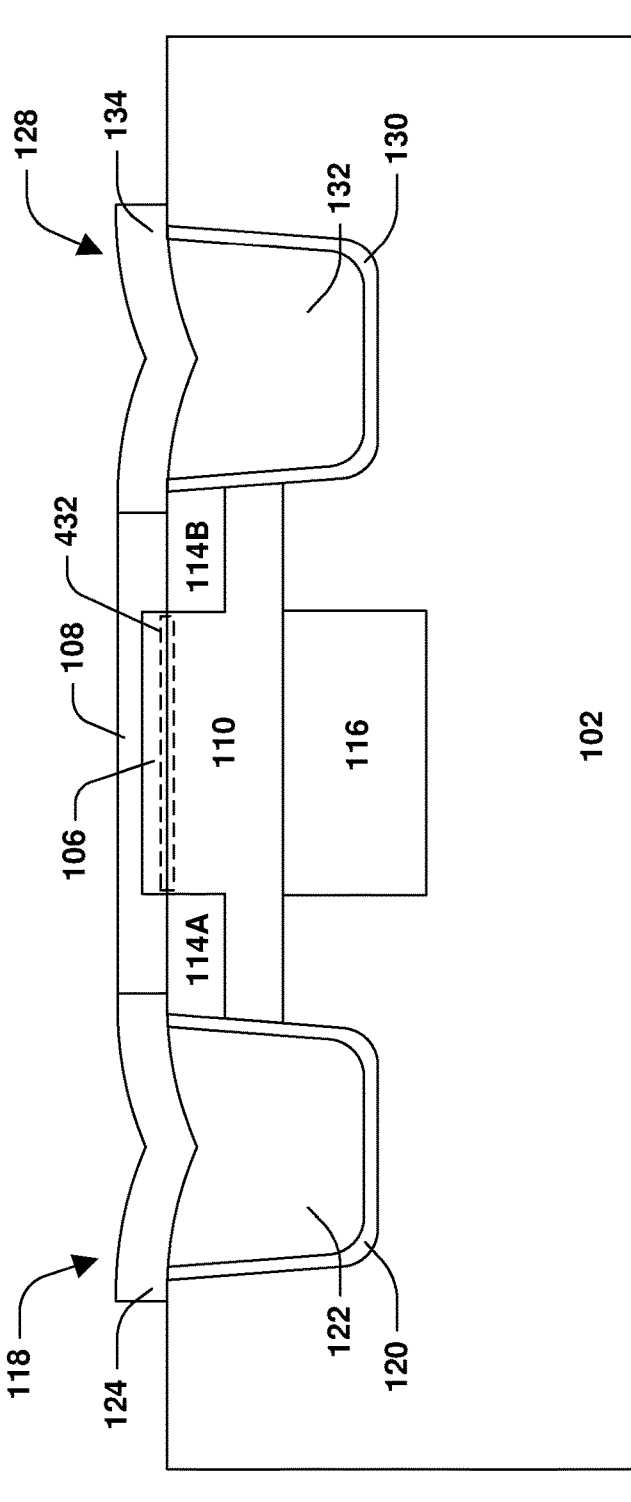

FIGS. 4A-4C illustrate aspects of a semiconductor device 400 according to various examples of the present disclosure. FIG. 4A illustrates a cross-sectional view of the semiconductor device 400 according to some embodiments. The semiconductor device 400 may comprise the semiconductor body 102, the first metal contact layer 106, the second metal contact layer 108, the first trench gate structure 118 and/or the second trench gate structure 128. In some examples, the semiconductor device 400 (and/or one or more components of the semiconductor device 400) may have one, some and/or all of the components, materials, arrangements, features, characteristics and/or relationships provided herein with respect to the semiconductor device 100 and/or shown in and/or described with respect to FIGS. 1A-1C and/or other parts of the present disclosure. In some examples, the semiconductor body 102 comprises (i) the first doped region of the first conductivity type, (ii) the first Schottky region 104 (e.g., a current spread region) of the second conductivity type different than the first conductivity type, and/or (iii) the source region (comprising the first portion 114A and the second portion 114B) of the second conductivity type. In some examples, the first conductivity type is p-type and/or the second conductivity type is n-type. In some examples, the first doped region comprises (i) the body region 110 having the first conductivity type and/or (ii) the shielding region 116 having the first conductivity type. In some examples, the body region 110 overlies the shielding region 116.

In some examples, the shielding region 116 and/or the first Schottky region 104 may be arranged differently in the semiconductor device 400 as compared with the semiconductor device 100 of FIGS. 1A-1C, the semiconductor device 200 of FIGS. 2A-2C and/or the semiconductor device 300 of FIGS. 3A-3C. In some examples, the first Schottky region 104 of the semiconductor device 400 may comprise a first portion 104G underlying (and/or in contact with and/or adjoining) the first metal contact layer 106, a second portion 104H underlying (and/or in contact with and/or adjoining) the first portion 110A of the body region 110, and/or a third portion 104I underlying (and/or in contact with and/or adjoining) the second portion 110B of the body region 110. In some examples, the first portion 104G of the first Schottky region 104 separates the first portion 110A of the body region 110 from the second portion 110B of the body region 110. In some examples, the second portion 104H of the first Schottky region 104 may be adjacent (and/or may be in contact with and/or may adjoin) the first sidewall 126 of the first trench gate structure 118. In some examples, the third portion 104I of the first Schottky region 104 may be adjacent (and/or may be in contact with and/or may adjoin) the second sidewall 136 of the second trench gate structure 128.

In some examples, the semiconductor device 400 comprises a first Schottky contact 406 comprising a junction of the first metal contact layer 106 with the first portion 104G of the first Schottky region 104. In some examples, the semiconductor device 400 comprises a first ohmic contact 402 comprising a junction of the first metal contact layer 106 with the first portion 110A of the body region 110 and/or a second ohmic contact 404 comprising a junction of the first metal contact layer 106 with the second portion 110B of the body region 110.

FIG. 4B illustrates a top view of the semiconductor device 400 according to some embodiments. In some examples, the view depicted in FIG. 4A is a cross sectional view taken along line A-A of FIG. 4B. For ease of illustration, the first metal contact layer 106 and/or the second metal contact layer 108 are removed in FIG. 4B to show a top view of doped regions (e.g., the source region, the first Schottky region 104, etc.) in the semiconductor body 102 of the semiconductor device 400. In some examples, the first Schottky region 104 is in an active area of a first transistor in a first portion 162 of the semiconductor device 400. In some examples, along the second direction 172, transistors may alternate between having a Schottky region and not having a Schottky region. For example, the first transistor may comprise the first Schottky region 104, a second transistor in a second portion 164 of the semiconductor device 400 may not comprise a Schottky region, a third transistor in a third portion 166 of the semiconductor device 400 may comprise a second Schottky region 160, etc. In some examples, the second Schottky region 160 may have one or more of the components, materials, arrangements, features, characteristics and/or relationships provided herein with respect to the first Schottky region 104. Embodiments are contemplated in which the second transistor may (also) comprise a Schottky region, and/or where each transistor of a set of transistors of the semiconductor device 400 (e.g., some and/or all transistors of the semiconductor device 400) comprises an integrated Schottky diode. Embodiments are contemplated in which the first Schottky region 104 extends (continuously, for example) through two or more adjacent portions of the semiconductor device 400 (e.g., the first portion 162, the second portion 164 and/or the third portion 166), wherein in each portion of the two or more adjacent portions, a Schottky contact is established between the first Schottky region 104 and a metal in the portion.

In some examples, a portion 424 of the semiconductor device 400 may separate the first Schottky region 104 from the second Schottky region 160 in the third portion 166. The portion 424 of the semiconductor device 400 may comprise a portion of the first doped region (which may comprise a portion of the body region 110 and/or a portion of the shielding region 116). In some examples, the portion 424 of the semiconductor device 400 (e.g., the portion of the first doped region) provides shielding between adjacent Schottky regions, such as the first Schottky region 104 and the second Schottky region 160, which may provide for improved performance of the semiconductor device 400.

FIG. 4C illustrates a cross sectional view of the second portion 164 of the semiconductor device 400 taken along line C-C of FIG. 4B, according to some embodiments. In some examples, the second portion 164 of the semiconductor device 400 may not comprise a Schottky region. In some examples, in the second portion 164 of the semiconductor device 400, the first metal contact layer 106 may be connected (e.g., electrically connected) to the first doped region (e.g., the body region 110 and/or the shielding region 116) via an ohmic contact 432.

A semiconductor device, such as the semiconductor device 100, the semiconductor device 200, the semiconductor device 300 and/or the semiconductor device 400, may comprise one or more superjunction regions (e.g., super-junction pillars). For example, the one or more superjunction regions may comprise (i) a first superjunction region (of the second conductivity type, for example) underlying the first trench gate structure 118, (ii) a second superjunction region (of the first conductivity type, for example) underlying the first metal contact layer 106, the second metal contact layer 108, the metal structure 112, and/or the first Schottky region 104, and/or (iii) a third superjunction region (of the second conductivity type, for example) underlying the second trench gate structure 128.

Figure 5:
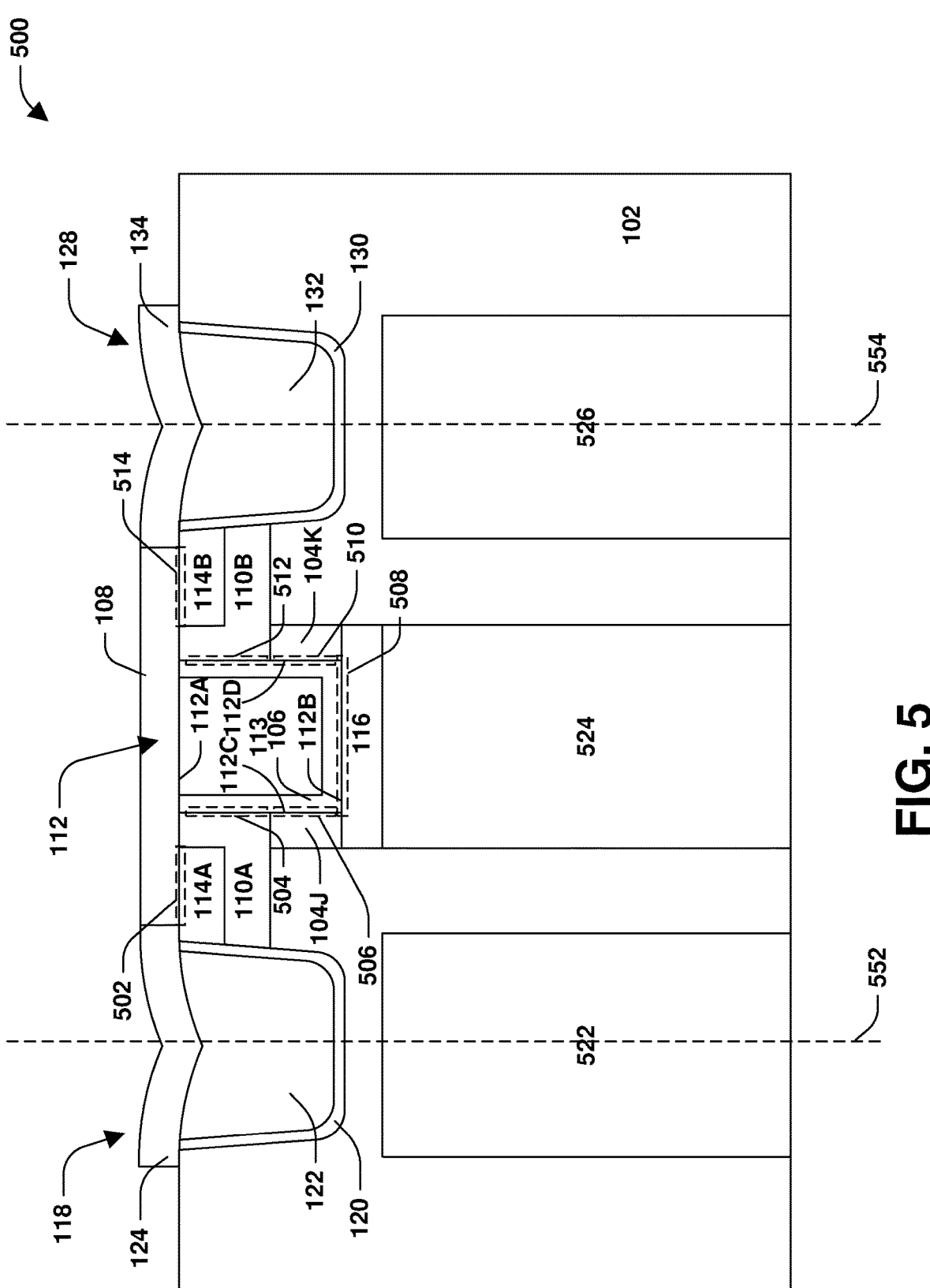
FIG. 5 illustrates a cross-sectional view of a semiconductor device according to various examples.
Figure 6:
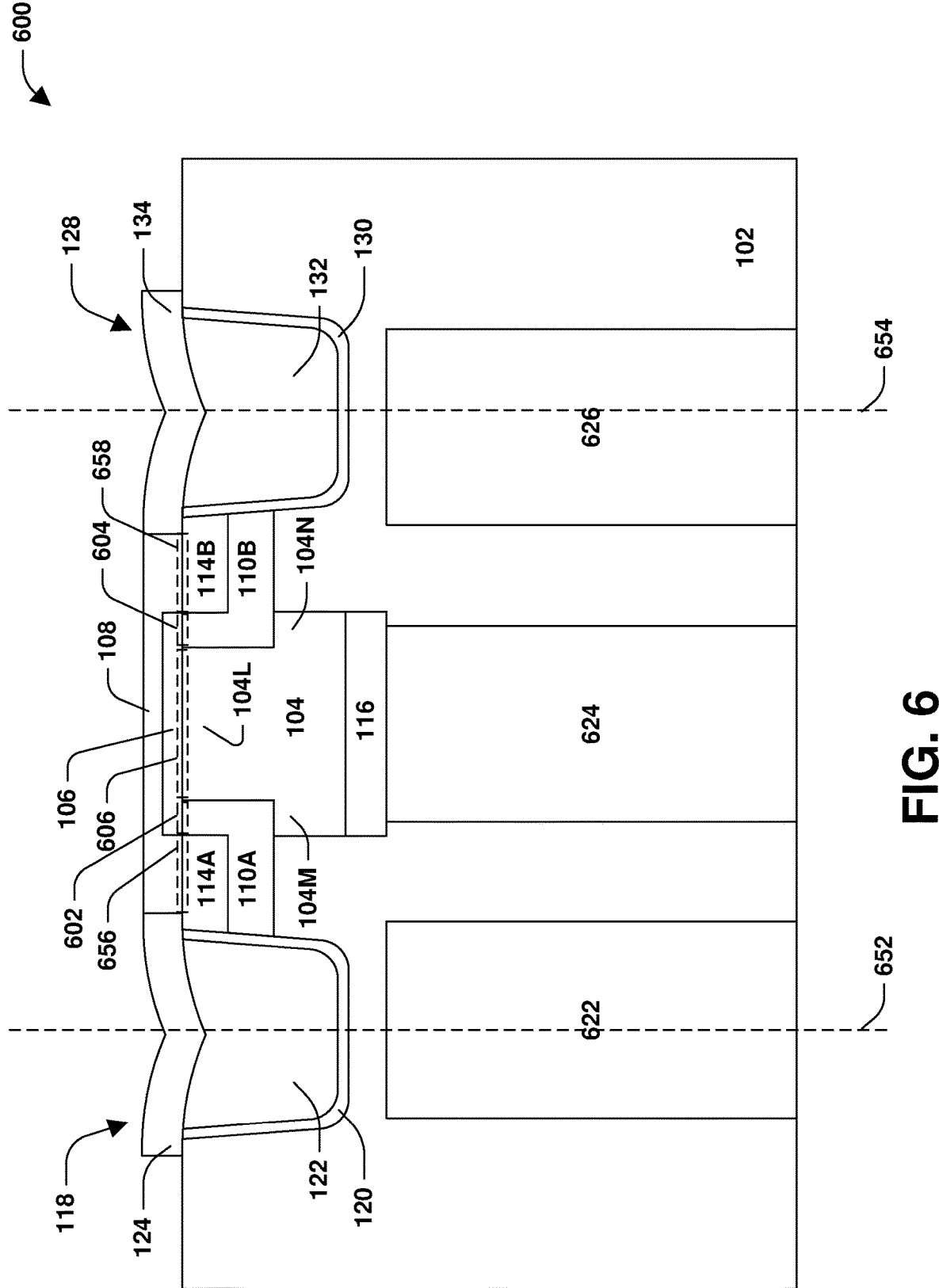
FIG. 6 illustrates a cross-sectional view of a semiconductor device according to various examples.

FIGS. 5-6 illustrate example semiconductor devices comprising superjunction regions. FIG. 5 illustrates a cross-sectional view of a semiconductor device 500 according to some embodiments. The semiconductor device 500 may comprise the semiconductor body 102, the metal structure 112 in the semiconductor body 102, the second metal contact layer 108, the first trench gate structure 118 and/or the second trench gate structure 128. In some examples, the semiconductor device 500 (and/or one or more components of the semiconductor device 500) may have one, some and/or all of the components, materials, arrangements, features, characteristics and/or relationships provided herein with respect to the semiconductor device 100 and/or shown in and/or described with respect to FIGS. 1A-1C and/or other parts of the present disclosure. In some examples, the semiconductor body 102 comprises (i) the first doped region of the first conductivity type, (ii) the first Schottky region 104 of the second conductivity type different than the first conductivity type, and/or (iii) the source region (comprising the first portion 114A and the second portion 114B) of the second conductivity type. In some examples, the first conductivity type is p-type and/or the second conductivity type is n-type. In some examples, the first doped region comprises (i) the body region 110 having the first conductivity type and/or (ii) the shielding region 116 having the first conductivity type. In some examples, the body region 110 overlies the shielding region 116. In some examples, a cell (e.g., a transistor cell) of the semiconductor device 500 is between line 552 and line 554, wherein the cell may comprise a mirrored structure.

In some examples, the first Schottky region 104 of the semiconductor device 500 comprises a first portion 104J underlying (and/or in contact with and/or adjoining) the first portion 110A of the body region 110 and/or a second portion 104K underlying (and/or in contact with and/or adjoining) the second portion 110B of the body region 110. In some examples, the metal structure 112 is between the first portion 104J and the second portion 104K of the first Schottky region 104. In some examples, the semiconductor device 500 comprises a first Schottky contact 506 comprising a junction of the third sidewall 112C of the metal structure 112 with the first portion 104J of the first Schottky region 104 and/or a second Schottky contact 510 comprising a junction of the fourth sidewall 112D of the metal structure 112 with the second portion 104K of the first Schottky region 104. In some examples, the semiconductor device 500 comprises a first ohmic contact 504 comprising a junction of the third sidewall 112C of the metal structure 112 with the first portion 110A of the body region 110, a second ohmic contact 512 comprising a junction of the fourth sidewall 112D of the metal structure 112 with the second portion 110B of the body region 110, a third ohmic contact 502 comprising a junction of the second metal contact layer 108 with the first portion 114A of the source region, a fourth ohmic contact 514 comprising a junction of the second metal contact layer 108 with the second portion 114B of the source region, and/or a fifth ohmic contact 508 comprising a junction of the second sidewall 112B of the metal structure 112 with the shielding region 116.

A depth of the second sidewall 112B (e.g., bottom sidewall) of the metal structure 112 may be tuned (by adjusting a depth of a trench formed to form the metal structure 112, etc.) to adjoin a portion of the shielding region 116 (such as shown in FIG. 5) or to adjoin a portion of the first Schottky region 104 (and/or other region of the semiconductor body 102). In an embodiment in which the second sidewall 112B of the metal structure 112 adjoins a portion of the first Schottky region 104, a Schottky contact may be established comprising a junction of the second sidewall 112B of the metal structure 112 with the portion of the first Schottky region 104. In some examples, when the second sidewall 112B of the metal structure 112 adjoins the portion of the first Schottky region 104, the second sidewall 112B may not be connected to the shielding region 116 in the cross-sectional view shown in FIG. 5 (e.g., the second sidewall 112B may be connected to the shielding region 116 in a portion of the semiconductor device 500 that is not illustrated in FIG. 5). In some examples, the semiconductor device 500 may have improved dynamic switching performance when the second sidewall 112B adjoins a portion of the shielding region 116 (such as shown in FIG. 5) as compared to an embodiment in which the second sidewall 112B adjoins a portion of the first Schottky region 104.

The semiconductor device 500 may comprise (i) a first superjunction region 522 (of the second conductivity type, for example) underlying the first trench gate structure 118, (ii) a second superjunction region 524 (of the first conductivity type, for example) underlying the second metal contact layer 108, the metal structure 112, the first Schottky region 104 and/or the shielding region 116, and/or (iii) a third superjunction region 526 (of the second conductivity type, for example) underlying the second trench gate structure 128. The first superjunction region 522 may comprise dopants of the second conductivity type (e.g., n-type), such as nitrogen dopants, phosphorus dopants and/or other n-type dopants. In some examples, a dopant concentration of dopants of the second conductivity type in the first superjunction region 522 is different than, such as greater than, the semiconductor body dopant concentration. The second superjunction region 524 may comprise dopants of the first conductivity type (e.g., p-type), such as aluminum dopants, boron dopants, gallium dopants, beryllium dopants and/or other p-type dopants. The third superjunction region 526 may comprise dopants of the second conductivity type (e.g., n-type), such as nitrogen dopants, phosphorus dopants and/or other n-type dopants. In some examples, a dopant concentration of dopants of the second conductivity type in the third superjunction region 526 is different than, such as greater than, the semiconductor body dopant concentration.

FIG. 6 illustrates a cross-sectional view of a semiconductor device 600 according to some embodiments. The semiconductor device 600 may comprise the semiconductor body 102, the first metal contact layer 106, the second metal contact layer 108, the first trench gate structure 118 and/or the second trench gate structure 128. In some examples, the semiconductor device 600 (and/or one or more components of the semiconductor device 600) may have one, some and/or all of the components, materials, arrangements, features, characteristics and/or relationships provided herein with respect to the semiconductor device 100 and/or shown in and/or described with respect to FIGS. 1A-1C and/or other parts of the present disclosure. In some examples, the semiconductor body 102 comprises (i) the first doped region of the first conductivity type, (ii) the first Schottky region 104 of the second conductivity type different than the first conductivity type, and/or (iii) the source region (comprising the first portion 114A and the second portion 114B) of the second conductivity type. In some examples, the first conductivity type is p-type and/or the second conductivity type is n-type. In some examples, the first doped region comprises (i) the body region 110 having the first conductivity type and/or (ii) the shielding region 116 having the first conductivity type. In some examples, the body region 110 overlies the shielding region 116. In some examples, a cell (e.g., a transistor cell) of the semiconductor device 600 is between line 652 and line 654, wherein the cell may comprise a mirrored structure.

In some examples, the first Schottky region 104 of the semiconductor device 600 may comprise a first portion 104L underlying (and/or in contact with and/or adjoining) the first metal contact layer 106, a second portion 104M underlying (and/or in contact with and/or adjoining) the first portion 110A of the body region 110, and/or a third portion 104N underlying (and/or in contact with and/or adjoining) the second portion 110B of the body region 110. In some examples, the first portion 104L of the first Schottky region 104 separates the first portion 110A of the body region 110 from the second portion 110B of the body region 110. In some examples, the semiconductor device 600 comprises a first Schottky contact 606 comprising a junction of the first metal contact layer 106 with the first portion 104L of the first Schottky region 104. In some examples, the semiconductor device 600 comprises a first ohmic contact 602 comprising a junction of the first metal contact layer 106 with the first portion 110A of the body region 110 and/or a second ohmic contact 604 comprising a junction of the first metal contact layer 106 with the second portion 110B of the body region 110.

The semiconductor device 600 may comprise (i) a first superjunction region 622 (of the second conductivity type, for example) underlying the first trench gate structure 118, (ii) a second superjunction region 624 (of the first conductivity type, for example) underlying the first metal contact layer 106, the second metal contact layer 108, the first Schottky region 104 and/or the shielding region 116, and/or (iii) a third superjunction region 626 (of the second conductivity type, for example) underlying the second trench gate structure 128. The first superjunction region 622 may comprise dopants of the second conductivity type (e.g., n-type), such as nitrogen dopants, phosphorus dopants and/or other n-type dopants. In some examples, a dopant concentration of dopants of the second conductivity type in the first superjunction region 622 is different than, such as greater than, the semiconductor body dopant concentration. The second superjunction region 624 may comprise dopants of the first conductivity type (e.g., p-type), such as aluminum dopants, boron dopants, gallium dopants, beryllium dopants and/or other p-type dopants. The third superjunction region 626 may comprise dopants of the second conductivity type (e.g., n-type), such as nitrogen dopants, phosphorus dopants and/or other n-type dopants. In some examples, a dopant concentration of dopants of the second conductivity type in the third superjunction region 626 is different than, such as greater than, the semiconductor body dopant concentration.

In an example, a single contact structure, such as a single contact layer, comprises the first metal contact layer 106 and the second metal contact layer 108 (e.g., the first metal contact layer 106 and the metal structure 112 are each part of the single contact structure). In some examples, the semiconductor device 600 may comprise (i) the first Schottky contact 606 comprising a junction of the single contact structure with the first portion 104L of the first Schottky region 104 (*ii*) the first ohmic contact 602 comprising a junction of the single contact structure with the first portion 110A of the body region 110, (iii) the second ohmic contact 604 comprising a junction of the single contact structure with the second portion 110B of the body region 110, (iv) a third ohmic contact 656 comprising a junction of the single contact structure with the first portion 114A of the source region, and/or (v) a fourth ohmic contact 658 comprising a junction of the single contact structure with the second portion 114B of the source region.

Figure 7:
FIG. 7 illustrates a cross-sectional view of a semiconductor device according to various examples.
Figure 7:
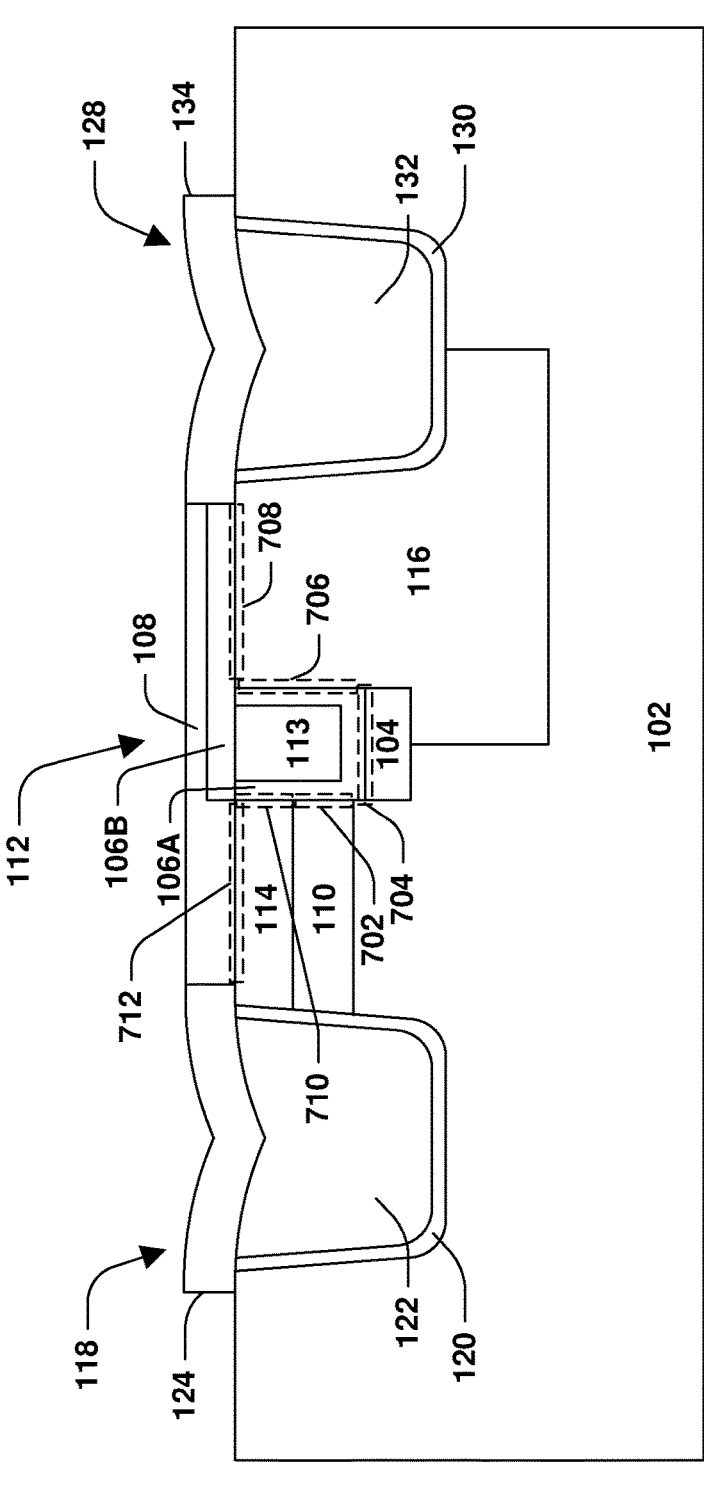

FIG. 7 illustrates a cross-sectional view of a semiconductor device 700 according to some embodiments. The semiconductor device 700 may comprise the semiconductor body 102, the metal structure 112, the second metal contact layer 108, the first trench gate structure 118 and/or the second trench gate structure 128. In some examples, the semiconductor device 700 (and/or one or more components of the semiconductor device 700) may have one, some and/or all of the components, materials, arrangements, features, characteristics and/or relationships provided herein with respect to the semiconductor device 100 and/or shown in and/or described with respect to FIGS. 1A-1C and/or other parts of the present disclosure. In some examples, the semiconductor body 102 comprises (i) the body region 110 of the first conductivity type, (ii) the shielding region 116 of the first conductivity type, (iii) the first Schottky region 104 of the second conductivity type different than the first conductivity type, and/or (iii) the source region 114 of the second conductivity type. In some examples, the first conductivity type is p-type and/or the second conductivity type is n-type. In some examples, the metal structure 112 is between the body region 110 and the shielding region 116.

In some examples, the metal structure 112 comprises a first portion 106A of the first metal contact layer 106 and the filling structure 113. In some examples, the first portion 106A of the first metal contact layer 106 separates the filling structure 113 from the semiconductor body 102. In some examples, the first metal contact layer 106 comprises a second portion 106B which overlies the filling structure 113, the first portion 106A of the first metal contact layer 106 and/or the shielding region 116. In some examples, the first metal contact layer 106 separates the second metal contact layer 108 from the shielding region 116.

In some examples, the semiconductor device 700 comprises a first Schottky contact 704 comprising a junction of a sidewall (e.g., a bottom sidewall) of the metal structure 112 with the first Schottky region 104. In some examples, the semiconductor device 700 comprises a first ohmic contact 702 comprising a junction of the metal structure 112 with the body region 110, a second ohmic contact 706 comprising a junction of the metal structure 112 with the shielding region 116, a third ohmic contact 708 comprising a junction of the second portion 106B of the first metal contact layer 106 with the shielding region 116, a fourth ohmic contact 710 comprising a junction of the metal structure 112 with the source region 114, and/or a fifth ohmic contact 712 comprising a junction of the second metal contact layer 108 with the source region 114.

In an example, a single contact structure, such as a single contact layer, comprises the first metal contact layer 106 and the second metal contact layer 108 (e.g., the first metal contact layer 106 and the metal structure 112 are each part of the single contact structure). In some examples, the third ohmic contact 708 may comprise a junction of the single contact structure with the shielding region 116. In some examples, the fifth ohmic contact 712 may comprise a junction of the single contact structure with the source region 114.

Figure 8:
FIG. 8 illustrates a cross-sectional view of a semiconductor device according to various examples.
Figure 8:
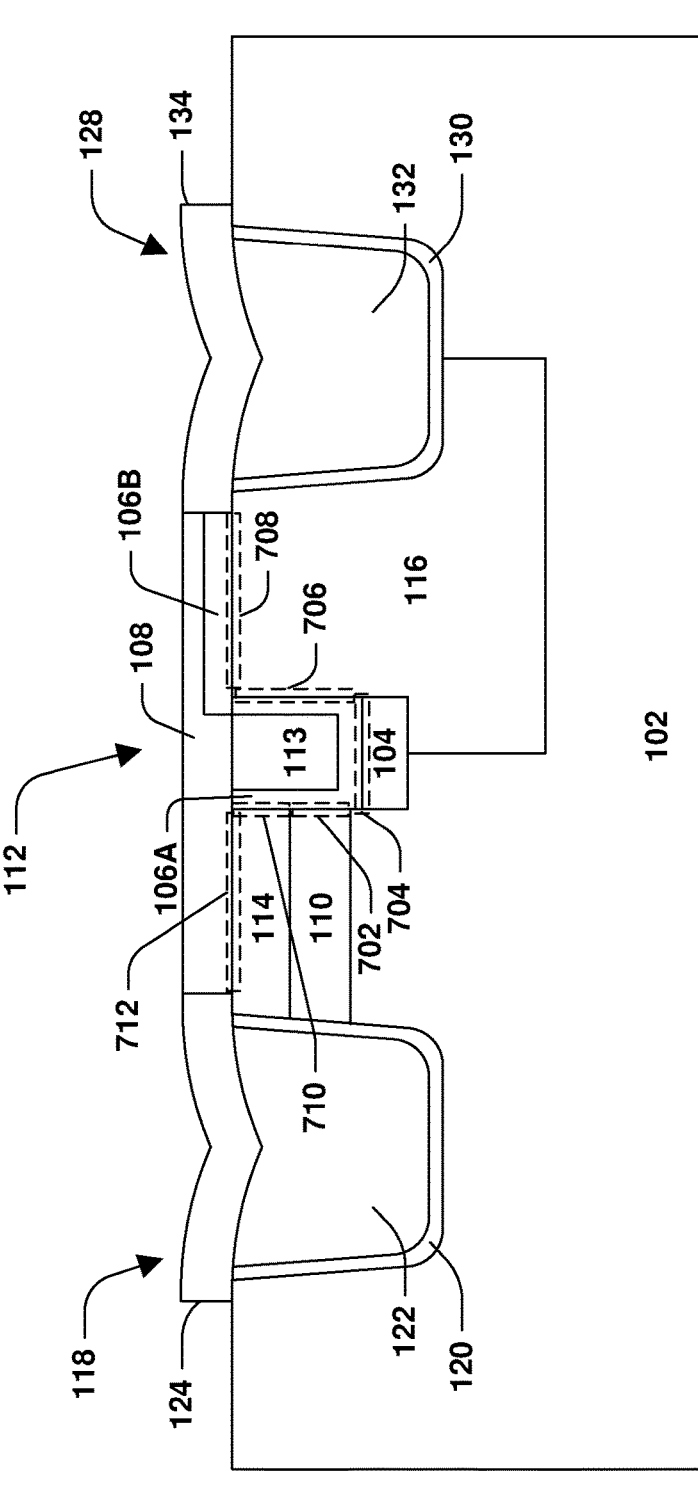

FIG. 8 illustrates a cross-sectional view of a semiconductor device 800 according to some embodiments. In some examples, the semiconductor device 800 (and/or one or more components of the semiconductor device 800) may have one, some and/or all of the components, materials, arrangements, features, characteristics and/or relationships provided herein with respect to the semiconductor device 100 and/or the semiconductor device 700 and/or shown in and/or described with respect to FIGS. 1A-1C and/or FIG. 7, and/or other parts of the present disclosure. In some examples, the first metal contact layer 106 may be arranged differently in the semiconductor device 800 as compared with the semiconductor device 700. For example, the second portion 106B of the first metal contact layer 106 in the semiconductor device 800 does not overlie the filling structure 113, whereas the second portion 106B of the first metal contact layer 106 in the semiconductor device 700 overlies the filling structure 113 (as shown in FIG. 7).

Figure 9:
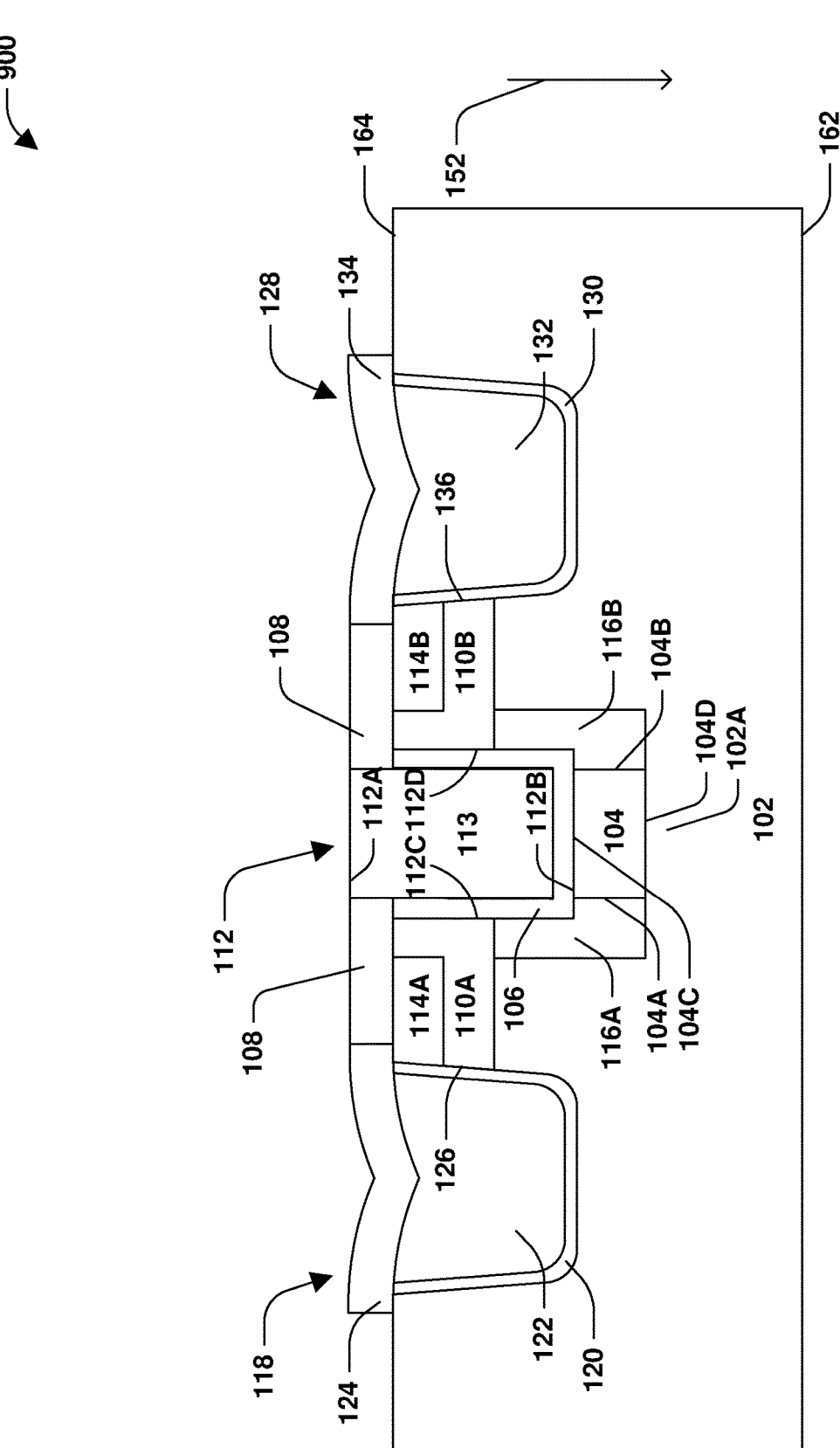
FIG. 9 illustrates a cross-sectional view of a semiconductor device according to various examples.

Embodiments are contemplated in which the filling structure 113 extends through at least some of the second metal contact layer 108, such as shown in FIG. 9 illustrating a cross-sectional view of a semiconductor device 900 according to some embodiments. In some examples, the semiconductor device 900 (and/or one or more components of the semiconductor device 900) may have one, some and/or all of the components, materials, arrangements, features, characteristics and/or relationships provided herein with respect to the semiconductor device 100 and/or shown in and/or described with respect to FIGS. 1A-1C, and/or other parts of the present disclosure.

Figure 10:
FIG. 10 illustrates a cross-sectional view of a semiconductor device according to various examples.
Figure 10:
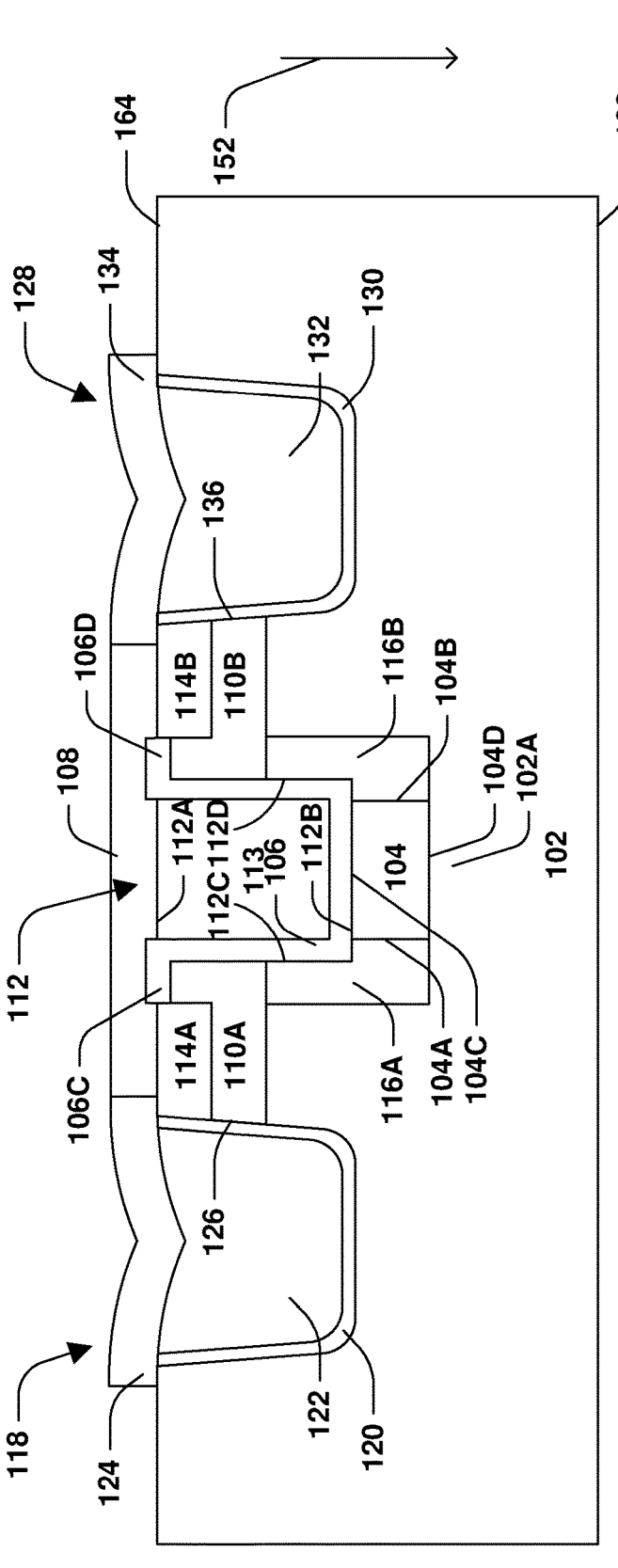

Embodiments are contemplated in which the first metal contact layer 106 comprises a portion overlying the first portion 110A of the body region 110 and/or the second portion 110B of the body region, such as shown in FIG. 10 illustrating a cross-sectional view of a semiconductor device 1000 according to some embodiments. In some examples, the semiconductor device 1000 (and/or one or more components of the semiconductor device 900) may have one, some and/or all of the components, materials, arrangements, features, characteristics and/or relationships provided herein with respect to the semiconductor device 100 and/or shown in and/or described with respect to FIGS. 1A-1C, and/or other parts of the present disclosure. In an example, a portion 106C of the first metal contact layer 106 overlies the first portion 110A of the body region 110 and/or a portion 106D of the first metal contact layer 106 overlies the second portion 110B of the body region.

A method may be contemplated for forming a semiconductor device provided herein, such as at least one of the semiconductor device 100, the semiconductor device 200, the semiconductor device 300, the semiconductor device 400, the semiconductor device 500, the semiconductor device 600, the semiconductor device 700 and/or other semiconductor device provided herein. The method may comprise performing one or more first implantation processes to implant dopants of the first conductivity type into the semiconductor body 102 to form the body region 110 and/or the shielding region 116. The method may comprise performing a second implantation process to implant dopants of the second conductivity type into the semiconductor body 102 to form the first Schottky region 104 of the second conductivity type. The method may comprise forming a first trench, and/or forming the metal structure 112 in the first trench. In an example, the second implantation process is performed by implanting dopants of the second conductivity type through a bottom of the first trench. The method may comprise forming the second metal contact layer 108 over the metal structure 112 and/or the first Schottky region 104. In some examples, the method may comprise forming a second trench and/or forming the first trench gate structure 118 in the second trench. The method may comprise forming a third trench and/or forming the second trench gate structure 128 in the third trench.

It may be appreciated that components, materials, arrangements, features, characteristics and/or relationships shown in and/or described with respect to different drawings of the present disclosure may be combined with each other to provide an embodiment within the scope of the present disclosure.

According to some embodiments, a semiconductor device is provided. The semiconductor device comprises a semiconductor body comprising a first doped region of a first conductivity type, and a second doped region of a second conductivity type; and a metal structure, in the semiconductor body, overlying the second doped region, wherein the metal structure comprises a first sidewall adjacent a first portion of the first doped region, a second sidewall adjacent a second portion of the first doped region, and a third sidewall adjacent the second doped region, and wherein a Schottky contact comprises a junction of the third sidewall of the metal structure with the second doped region.

According to some embodiments, an ohmic contact comprises a junction of the first sidewall of the metal structure with the first portion of the first doped region and/or a junction of the second sidewall of the metal structure with the second portion of the first doped region.

According to some embodiments, a first side of the second doped region abuts a third portion of the first doped region underlying the first portion of the first doped region, and a second side of the second doped region abuts a fourth portion of the first doped region underlying the second portion of the first doped region.

According to some embodiments, a first portion of the second doped region underlies the first portion of the first doped region, a second portion of the second doped region underlies the second portion of the first doped region, and a third portion of the second doped region, between the first portion of the second doped region and the second portion of the second doped region, underlies the metal structure.

According to some embodiments, a first concentration of first dopants of the second conductivity type in a first portion of the second doped region is greater than a second concentration of second dopants of the second conductivity type in a second portion of the second doped region, wherein the first portion of the second doped region overlies the second portion of the second doped region.

According to some embodiments, the semiconductor device comprises a trench gate structure, in the semiconductor body, comprising a gate electrode and a gate dielectric layer separating the gate electrode from the semiconductor body; and a source region, of the second conductivity type, between the trench gate structure and the metal structure.

According to some embodiments, the semiconductor device comprises a second trench gate structure, in the semiconductor body, comprising a second gate electrode and a second gate dielectric layer separating the second gate electrode from the semiconductor body, wherein the metal structure is between the trench gate structure and the second trench gate structure; and a second source region, of the second conductivity type, between the second trench gate structure and the metal structure.

According to some embodiments, the first doped region comprises a shielding region and a body region over the shielding region.

According to some embodiments, the semiconductor device comprises a first portion comprising a first transistor; a second portion comprising a second transistor; and a third portion comprising a third transistor, wherein the second portion of the semiconductor device is between the first portion of the semiconductor device and the third portion of the semiconductor device, wherein the second doped region is in the first portion of the semiconductor device, wherein the third portion of the semiconductor device comprises a third doped region of the second conductivity type and a second metal structure, wherein a second Schottky contact comprises a junction of the second metal structure with the third doped region, and wherein a third portion of the first doped region separates the second doped region from the third doped region.

According to some embodiments, a vertical position of the second doped region matches a vertical position of the third doped region.

According to some embodiments, a vertical position of the metal structure matches a vertical position of the first portion of the first doped region and a vertical position of the second portion of the first doped region.

According to some embodiments, the metal structure comprises a filling structure and a metal contact layer separating the filling structure from the semiconductor body, wherein the first sidewall comprises a first portion of the metal contact layer, the second sidewall comprises a second portion of the metal contact layer and/or the third sidewall comprises a third portion of the metal contact layer.

According to some embodiments, the semiconductor body comprises a silicon carbide (SiC) substrate and/or a SiC epitaxial layer.

According to some embodiments, the metal structure comprises titanium, aluminum, titanium aluminide, and/or molybdenum nitride (MoN).

According to some embodiments, the first conductivity type is p-type and the second conductivity type is n-type.

According to some embodiments, a semiconductor device is provided. The semiconductor device comprises a semiconductor body comprising a first doped region of a first conductivity type, a second doped region of a second conductivity type, a third doped region of the first conductivity type and a source region of the second conductivity type; a first metal contact layer overlying the semiconductor body and adjacent the source region; and a metal structure in the semiconductor body, wherein the metal structure comprises at least three of (i) a first sidewall adjacent a first portion of the first doped region and a first portion of the second doped region, (ii) a second sidewall adjacent a second portion of the first doped region and a second portion of the second doped region, (iii) a third sidewall adjacent the third doped region, or (iv) a fourth sidewall adjacent the first metal contact layer, and wherein a Schottky contact comprises a junction of the first sidewall of the metal structure with the first portion of the second doped region and/or a junction of the second sidewall of the metal structure with the second portion of the second doped region.

According to some embodiments, the semiconductor device comprises a trench gate structure, in the semiconductor body, comprising a gate electrode and a gate dielectric layer separating the gate electrode from the semiconductor body, wherein the source region is between the trench gate structure and the metal structure; a first superjunction region, of the first conductivity type, underlying the metal structure; and a second superjunction region, of the second conductivity type, underlying the trench gate structure.

According to some embodiments, the semiconductor device comprises a first portion comprising a first transistor; a second portion comprising a second transistor; and a third portion comprising a third transistor, wherein the second portion of the semiconductor device is between the first portion of the semiconductor device and the third portion of the semiconductor device, wherein the second doped region is in the first portion of the semiconductor device, wherein the third portion of the semiconductor device comprises a fourth doped region of the second conductivity type and a second metal structure, wherein a second Schottky contact comprises a junction of the second metal structure with the fourth doped region, and wherein a third portion of the first doped region and/or a portion of the third doped region separate the second doped region from the fourth doped region.

According to some embodiments, the first conductivity type is p-type and the second conductivity type is n-type.

According to some embodiments, a vertical position of a first portion of the metal structure matches a vertical position the a first portion of the first doped region and a vertical position of the second portion of the first doped region, wherein a vertical position of a second portion of the metal structure matches a vertical position of a first portion of the second doped region and a vertical position of a second portion of the second doped region.

According to some embodiments, the metal structure comprises a filling structure and a second metal contact layer separating the filling structure from the semiconductor body, wherein at least three of the first sidewall comprises (i) a first portion of the second metal contact layer, (ii) the second sidewall comprises a second portion of the second metal contact layer, (iii) the third sidewall comprises a third portion of the second metal contact layer, or (iv) the fourth sidewall comprises at least one of a fourth portion of the second metal contact layer or a portion of the filling structure.

According to some embodiments, a semiconductor device is provided. The semiconductor device comprises a semiconductor body comprising a first doped region of a first conductivity type, a second doped region of a second conductivity type, a third doped region of the first conductivity type, and a source region of the second conductivity type; a first metal contact layer overlying the semiconductor body and adjacent a first portion of the first doped region, a second portion of the first doped region and a first portion of the second doped region; and a second metal contact layer overlying the first metal contact layer and adjacent the source region, wherein the first portion of the second doped region separates the first portion of the first doped region from the second portion of the first doped region, wherein the second doped region overlies the third doped region, and wherein a Schottky contact comprises a junction of the first metal contact layer with the first portion of the second doped region.

According to some embodiments, the semiconductor device comprises a first trench gate structure, in the semiconductor body, comprising a first gate electrode and a first gate dielectric layer separating the first gate electrode from the semiconductor body; and a second trench gate structure, in the semiconductor body, comprising a second gate electrode and a second gate dielectric layer separating the second gate electrode from the semiconductor body, wherein a second portion of the second doped region underlies the first portion of the first doped region and is adjacent the first trench gate structure, and wherein a third portion of the second doped region underlies the second portion of the first doped region and is adjacent the second trench gate structure.

According to some embodiments, the semiconductor device comprises a first portion comprising a first transistor; a second portion comprising a second transistor; and a third portion comprising a third transistor, wherein the second portion of the semiconductor device is between the first portion of the semiconductor device and the third portion of the semiconductor device, wherein the second doped region is in the first portion of the semiconductor device, wherein the third portion of the semiconductor device comprises a second Schottky contact comprising a junction of a fourth doped region of the second conductivity type with a third metal contact layer, and wherein a third portion of the first doped region and/or a portion of the third doped region separate the second doped region from the fourth doped region.

According to some embodiments, a vertical position of the first portion of the second doped region matches a vertical position of the first portion of the first doped region and a vertical position of the second portion of the first doped region.

It may be appreciated that combinations of one or more embodiments described herein, including combinations of embodiments described with respect to different figures, are contemplated herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed as to imply that these operations are necessarily order dependent. Alternative ordering may be implemented without departing from the scope of the disclosure. Further, it will be understood that not all operations are necessarily present in each embodiment provided herein. Also, it will be understood that not all operations are necessary in some embodiments.

Any aspect or design described herein as an "example" and/or the like is not necessarily to be construed as advantageous over other aspects or designs. Rather, use of the word "example" and/or the like is intended to present one possible aspect and/or implementation that may pertain to the techniques presented herein. Such examples are not necessary for such techniques or intended to be limiting. Various embodiments of such techniques may include such an example, alone or in combination with other features, and/or may vary and/or omit the illustrated example.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims may generally be construed to mean "one or more" unless specified otherwise or clear from context to be directed to a singular form. Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the disclosure. In addition, while a particular feature of the disclosure may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

While the subject matter has been described with reference to illustrative embodiments, this description is not intended to be construed in a limiting sense. Various modifications and combinations of the illustrative embodiments, as well as other embodiments of the present disclosure, will be apparent to persons skilled in the art upon reference to the description. It is therefore intended that the appended claims encompass any such modifications or embodiments.

What is claimed is:

1. A semiconductor device, comprising:
a semiconductor body comprising:
a first doped region of a first conductivity type; and
a second doped region of a second conductivity type different than the first conductivity type; and
a metal structure, in the semiconductor body, overlying the second doped region of the second conductivity type, wherein:
the metal structure comprises:
a first sidewall adjacent a first portion of the first doped region of the first conductivity type;
a second sidewall adjacent a second portion of the first doped region of the first conductivity type; and
a third sidewall adjacent the second doped region of the second conductivity type; and
a Schottky contact comprises a junction of the third sidewall of the metal structure with the second doped region of the second conductivity type.

2. The semiconductor device of claim 1, wherein:
an ohmic contact comprises at least one of:
a junction of the first sidewall of the metal structure with the first portion of the first doped region; or
a junction of the second sidewall of the metal structure with the second portion of the first doped region.

3. The semiconductor device of claim 1, wherein:
a first side of the second doped region abuts a third portion of the first doped region underlying the first portion of the first doped region; and
a second side of the second doped region abuts a fourth portion of the first doped region underlying the second portion of the first doped region.

4. The semiconductor device of claim 1, wherein:
a first portion of the second doped region underlies the first portion of the first doped region;
a second portion of the second doped region underlies the second portion of the first doped region; and
a third portion of the second doped region, between the first portion of the second doped region and the second portion of the second doped region, underlies the metal structure.

5. The semiconductor device of claim 1, wherein:
a first concentration of first dopants of the second conductivity type in a first portion of the second doped region is greater than a second concentration of second dopants of the second conductivity type in a second portion of the second doped region; and
the first portion of the second doped region overlies the second portion of the second doped region.

6. The semiconductor device of claim 1, comprising:
a trench gate structure, in the semiconductor body, comprising a gate electrode and a gate dielectric layer separating the gate electrode from the semiconductor body; and
a source region, of the second conductivity type, between the trench gate structure and the metal structure.

7. The semiconductor device of claim 6, comprising:
a second trench gate structure, in the semiconductor body, comprising a second gate electrode and a second gate dielectric layer separating the second gate electrode from the semiconductor body, wherein the metal structure is between the trench gate structure and the second trench gate structure; and
a second source region, of the second conductivity type, between the second trench gate structure and the metal structure.

8. The semiconductor device of claim 1, wherein the first doped region comprises:
a shielding region; and
a body region over the shielding region.

9. The semiconductor device of claim 1, comprising:
a first portion comprising a first transistor;
a second portion comprising a second transistor; and
a third portion comprising a third transistor, wherein:
the second portion of the semiconductor device is between the first portion of the semiconductor device and the third portion of the semiconductor device;
the second doped region is in the first portion of the semiconductor device;
the third portion of the semiconductor device comprises:
a third doped region of the second conductivity type; and
a second metal structure;
a second Schottky contact comprises a junction of the second metal structure with the third doped region; and
a third portion of the first doped region separates the second doped region from the third doped region.

10. The semiconductor device of claim 1, comprising:
a superjunction region, of the first conductivity type, underlying the metal structure.

11. The semiconductor device of claim 1, wherein:
a vertical position of the metal structure matches:
   a vertical position of the first portion of the first doped region; and
   a vertical position of the second portion of the first doped region.

12. The semiconductor device of claim 1, wherein:
the metal structure comprises:
   a filling structure; and
   a metal contact layer separating the filling structure from the semiconductor body;
the first sidewall comprises a first portion of the metal contact layer;
the second sidewall comprises a second portion of the metal contact layer; and
the third sidewall comprises a third portion of the metal contact layer.

13. The semiconductor device of claim 1, wherein:
the metal structure comprises at least one of titanium, aluminum, titanium aluminide, or molybdenum nitride (MoN).

14. A semiconductor device, comprising:
a semiconductor body comprising:
   a first doped region of a first conductivity type;
   a second doped region of a second conductivity type different than the first conductivity type;
   a third doped region of the first conductivity type; and
   a source region of the second conductivity type;
a first metal contact layer overlying the semiconductor body and adjacent the source region of the second conductivity type; and
a metal structure in the semiconductor body, wherein:
   the metal structure comprises at least three of:
      a first sidewall adjacent a first portion of the first doped region of the first conductivity type and a first portion of the second doped region of the second conductivity type;
      a second sidewall adjacent a second portion of the first doped region of the first conductivity type and a second portion of the second doped region of the second conductivity type;
      a third sidewall adjacent the third doped region of the first conductivity type; or
      a fourth sidewall adjacent the first metal contact layer; and
   a Schottky contact comprises at least one of:
      a junction of the first sidewall of the metal structure with the first portion of the second doped region of the second conductivity type; or
      a junction of the second sidewall of the metal structure with the second portion of the second doped region of the second conductivity type.

15. The semiconductor device of claim 14, comprising:
a trench gate structure, in the semiconductor body, comprising a gate electrode and a gate dielectric layer separating the gate electrode from the semiconductor body, wherein the source region is between the trench gate structure and the metal structure;
a first superjunction region, of the first conductivity type, underlying the metal structure; and
a second superjunction region, of the second conductivity type, underlying the trench gate structure.

16. The semiconductor device of claim 15, comprising:
a first portion comprising a first transistor;
a second portion comprising a second transistor; and
a third portion comprising a third transistor, wherein:

the second portion of the semiconductor device is between the first portion of the semiconductor device and the third portion of the semiconductor device;
the second doped region is in the first portion of the semiconductor device;
the third portion of the semiconductor device comprises:
   a fourth doped region of the second conductivity type; and
   a second metal structure;
a second Schottky contact comprises a junction of the second metal structure with the fourth doped region; and
at least one of a third portion of the first doped region or a portion of the third doped region separates the second doped region from the fourth doped region.

17. The semiconductor device of claim 14, wherein:
a vertical position of a first portion of the metal structure matches:
   a vertical position of the first portion of the first doped region; and
   a vertical position of the second portion of the first doped region; and
a vertical position of a second portion of the metal structure matches:
   a vertical position of the first portion of the second doped region; and
   a vertical position of the second portion of the second doped region.

18. The semiconductor device of claim 14, wherein:
the metal structure comprises:
   a filling structure; and
   a second metal contact layer separating the filling structure from the semiconductor body; and
at least three of:
   the first sidewall comprises a first portion of the second metal contact layer;
   the second sidewall comprises a second portion of the second metal contact layer;
   the third sidewall comprises a third portion of the second metal contact layer; and
   the fourth sidewall comprises at least one of a fourth portion of the second metal contact layer or a portion of the filling structure.

19. A semiconductor device, comprising:
a semiconductor body comprising:
   a first doped region of a first conductivity type;
   a second doped region of a second conductivity type different than the first conductivity type;
   a third doped region of the first conductivity type; and
   a source region of the second conductivity type;
a first metal contact layer overlying the semiconductor body and adjacent:
   a first portion of the first doped region of the first conductivity type;
   a second portion of the first doped region of the first conductivity type; and
   a first portion of the second doped region of the second conductivity type; and
a second metal contact layer overlying the first metal contact layer and adjacent the source region of the second conductivity type, wherein:
   the first portion of the second doped region of the second conductivity type separates the first portion of the first doped region of the first conductivity type from the second portion of the first doped region of the first conductivity type;

the second doped region of the second conductivity type overlies the third doped region of the first conductivity type; and a Schottky contact comprises a junction of the first metal contact layer with the first portion of the second doped region of the second conductivity type.

20. The semiconductor device of claim 19, comprising:

a first trench gate structure, in the semiconductor body, comprising a first gate electrode and a first gate dielectric layer separating the first gate electrode from the semiconductor body; and a second trench gate structure, in the semiconductor body, comprising a second gate electrode and a second gate dielectric layer separating the second gate electrode from the semiconductor body, wherein:

a second portion of the second doped region underlies the first portion of the first doped region and is adjacent the first trench gate structure; and a third portion of the second doped region underlies the second portion of the first doped region and is adjacent the second trench gate structure.

21. The semiconductor device of claim 19, comprising:

a first portion comprising a first transistor;

a second portion comprising a second transistor; and a third portion comprising a third transistor, wherein:

the second portion of the semiconductor device is between the first portion of the semiconductor device and the third portion of the semiconductor device;

the second doped region is in the first portion of the semiconductor device;

the third portion of the semiconductor device comprises a second Schottky contact comprising a junction of a fourth doped region of the second conductivity type with a third metal contact layer; and at least one of a third portion of the first doped region or a portion of the third doped region separates the second doped region from the fourth doped region.

22. The semiconductor device of claim 19, comprising:

a trench gate structure; and a superjunction region, of the second conductivity type, underlying the trench gate structure.

* * * * *